(12) United States Patent
Nieuwejaar et al.

(10) Patent No.: US 9,911,487 B2
(45) Date of Patent: Mar. 6, 2018

(54) METHOD AND SYSTEM FOR STORING AND RECOVERING DATA FROM FLASH MEMORY

(71) Applicant: EMC Corporation, Hopkinton, MA (US)

(72) Inventors: Nils Nieuwejaar, Belmont, CA (US); Jeffrey S. Bonwick, Santa Clara, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 318 days.

(21) Appl. No.: 14/754,838

(22) Filed: Jun. 30, 2015

(65) Prior Publication Data

US 2016/0343429 A1 Nov. 24, 2016

Related U.S. Application Data

(60) Provisional application No. 62/163,782, filed on May 19, 2015.

(51) Int. Cl.
| | |
|---|---|
| *G06F 12/00* | (2006.01) |
| *G11C 11/56* | (2006.01) |
| *G06F 3/06* | (2006.01) |
| *G06F 11/07* | (2006.01) |

(52) U.S. Cl.
CPC ........ *G11C 11/5628* (2013.01); *G06F 3/0611* (2013.01); *G06F 3/0619* (2013.01); *G06F 3/0644* (2013.01); *G06F 3/0646* (2013.01); *G06F 3/0679* (2013.01); *G06F 3/0688* (2013.01); *G06F 11/0727* (2013.01); *G06F 11/0751* (2013.01); *G06F 11/0793* (2013.01)

(58) Field of Classification Search
CPC .... G06F 3/0611; G06F 3/0619; G06F 3/0644; G06F 3/0646; G06F 3/0688; G06F 11/0727; G06F 11/0751; G06F 11/0793
USPC ........................................................ 711/103
See application file for complete search history.

(56) References Cited

U.S. PATENT DOCUMENTS

| | | | |
|---|---|---|---|
| 8,301,832 B1* | 10/2012 | Moore | G06F 3/061 711/103 |
| 8,370,567 B1 | 2/2013 | Bonwick et al. | |
| 8,601,206 B1 | 12/2013 | Shapiro | |
| 2007/0220227 A1 | 9/2007 | Long | |
| 2011/0093650 A1 | 4/2011 | Kwon et al. | |
| 2013/0086320 A1* | 4/2013 | Black | G06F 3/0611 711/118 |

FOREIGN PATENT DOCUMENTS

WO 2013/142673 A1 9/2013

OTHER PUBLICATIONS

Extended European Search Report in correspnding European Application No. 16170491.1 dated Sep. 8, 2016 (9 pages).
Notification of Grounds of Rejection issued in corresponding Japanese Application No. 2016-099400, dated May 30, 2017 (10 pages).

* cited by examiner

*Primary Examiner* — Matthew Bradley
(74) *Attorney, Agent, or Firm* — Chamberlain Hrdlicka

(57) ABSTRACT

Embodiments of the technology relate to storing user data and metadata in persistent storage in the event of a power failure and then recovering such stored data and metadata when power is restored.

18 Claims, 27 Drawing Sheets

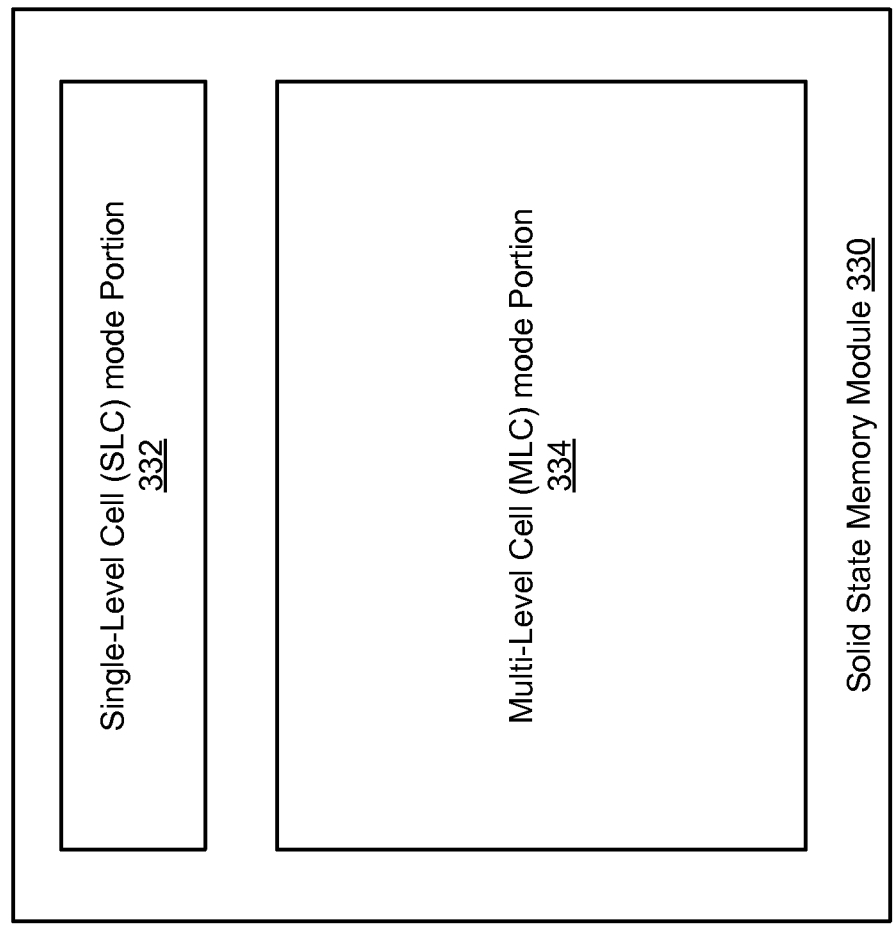

TOC Entry (430) | Object ID 432 | Birth time 434 | Offset ID 436 | Fragment Size 438 | Page ID 440 | Byte 442 | Logical Length 444 | Type 446 | Kind 448 | Reserved 450

FIG. 4F

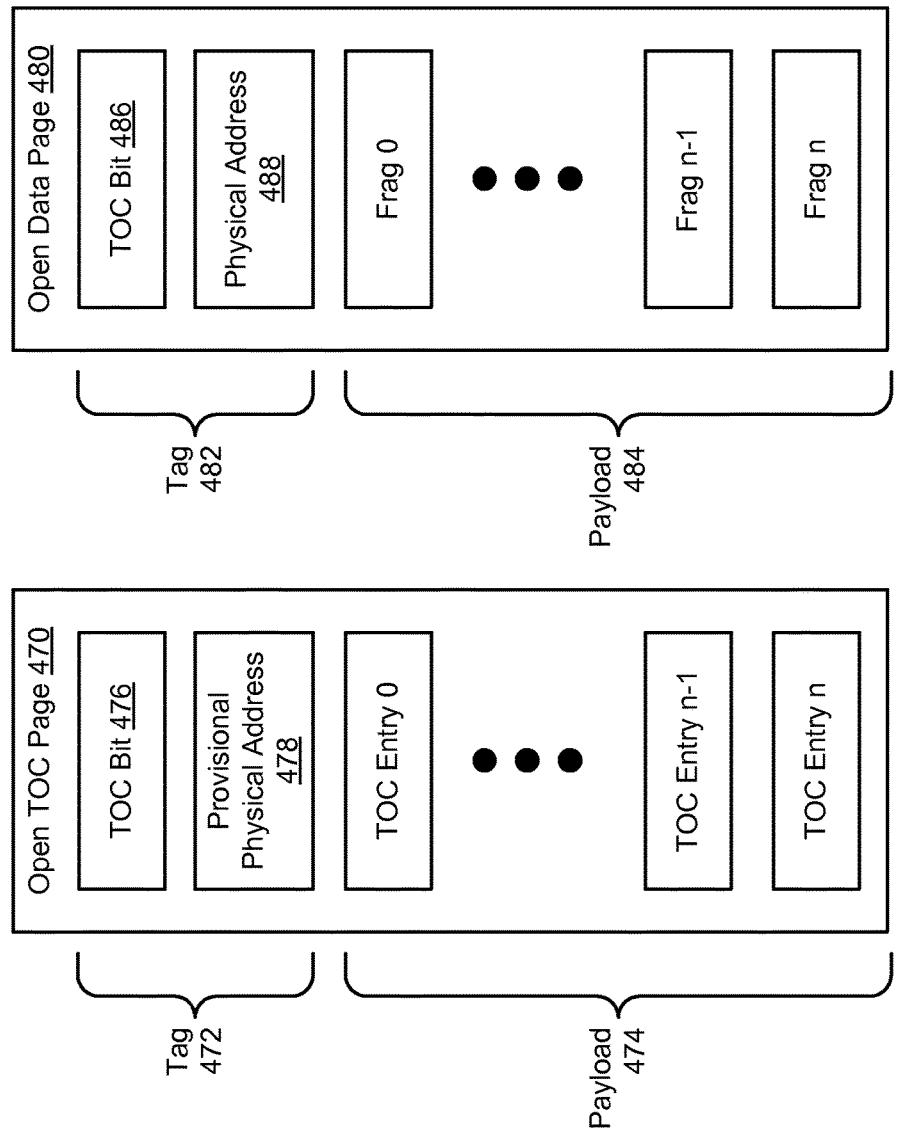

METHOD AND SYSTEM FOR STORING AND RECOVERING DATA FROM FLASH MEMORY

CROSS-REFERENCE TO RELATED APPLICATIONS

This application claims priority to U.S. Provisional Patent Application Ser. No. 62/163,782, filed on May 19, 2015. U.S. Provisional Patent Application Ser. No. 62/163,782 is hereby incorporated by reference in its entirety.

BACKGROUND

The speed at which a system can write data to persistent storage and read data from persistent storage is often a critical factor in the overall performance of the system. The traditional approach to reading data from and writing data to persistent storage requires processing by multiple layers in the system kernel and by multiple entities in the hardware. As a result, reading data from and writing data to persistent storage introduces significant latency in the system and, consequently, reduces the overall performance of the system.

BRIEF DESCRIPTION OF DRAWINGS

FIGS. 3A and 3B show a storage module in accordance with one or more embodiments of the technology.

FIG. 4F shows a table of contents (TOC) entry in accordance with one or more embodiments of the technology.

FIG. 4H shows an open TOC page in accordance with one or more embodiments of the technology.

FIG. 4I shows an open data page in accordance with one or more embodiments of the technology.

DETAILED DESCRIPTION

Specific embodiments of the technology will now be described in detail with reference to the accompanying figures. In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

In the following description of FIGS. 1A-8B, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology relate to a storage system. More specifically, embodiments of the technology relate to a storage system that includes self-describing data. Further, embodiments of the technology relate to a storage system in which all metadata required to access the user data stored in the storage system is located with the user data it is describing. Additionally, the metadata is used to populate an in-memory data structure that allows the storage system to directly access the user data using only the in-memory data structure. In addition, embodiments of the technology relate to storing user data and metadata in persistent storage in the event of a power failure (or other system failure) and then recovering such stored data and metadata when power is restored.

Figure 1A:
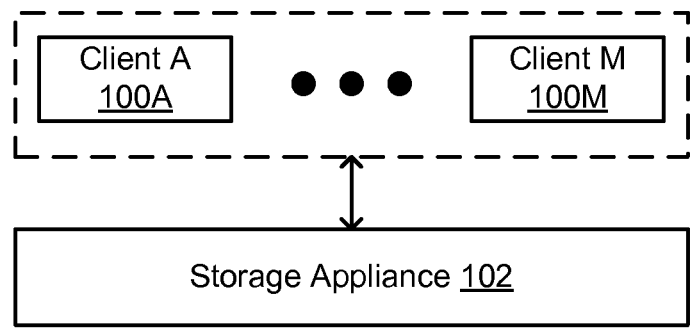
FIGS. 1A-1E show systems in accordance with one or more embodiments of the technology.

FIGS. 1A-1E show systems in accordance with one or more embodiments of the technology. Referring to FIG. 1A, the system includes one or more clients (client A (100A), client M (100M)) operatively connected to a storage appliance (102).

In one embodiment of the technology, clients (100A, 100M) correspond to any system that includes functionality to issue a read request to the storage appliance (102) and/or issue a write request to the storage appliance (102). Though not shown in FIG. 1A, each of the clients (100A, 100M) may include a client processor and client memory. Additional details about components in a client are described in FIG. 1D below. In one embodiment of the technology, the clients (100A, 100M) are configured to communicate with the storage appliance (102) using one or more of the following protocols: Peripheral Component Interconnect (PCI), PCI-Express (PCIe), PCI-eXtended (PCI-X), Non-Volatile Memory Express (NVMe), Non-Volatile Memory Express (NVMe) over a PCI-Express fabric, Non-Volatile Memory Express (NVMe) over an Ethernet fabric, and Non-Volatile Memory Express (NVMe) over an Infiniband fabric. Those skilled in the art will appreciate that the technology is not limited to the aforementioned protocols.

In one or more embodiments of the technology, if the client implements PCI, PCI-express, or NVMe, then the client includes a root complex (not shown). In one embodiment of the technology, the root complex is a device that connects the client processor and client memory to the PCIe Fabric. In one embodiment of the technology, the root complex is integrated into the client processor.

Figure 1B:
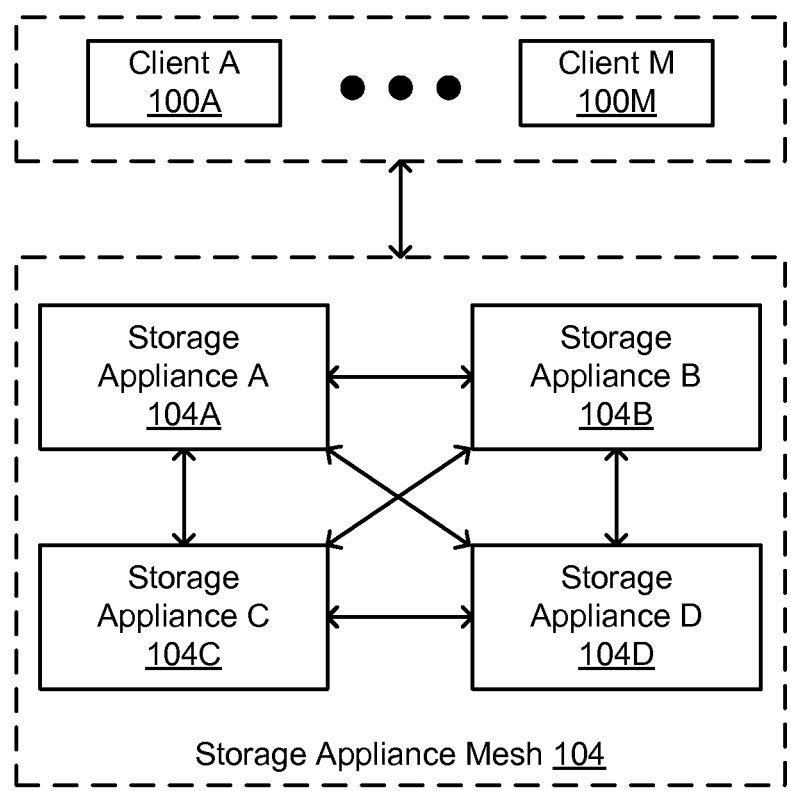
Figure 1C:
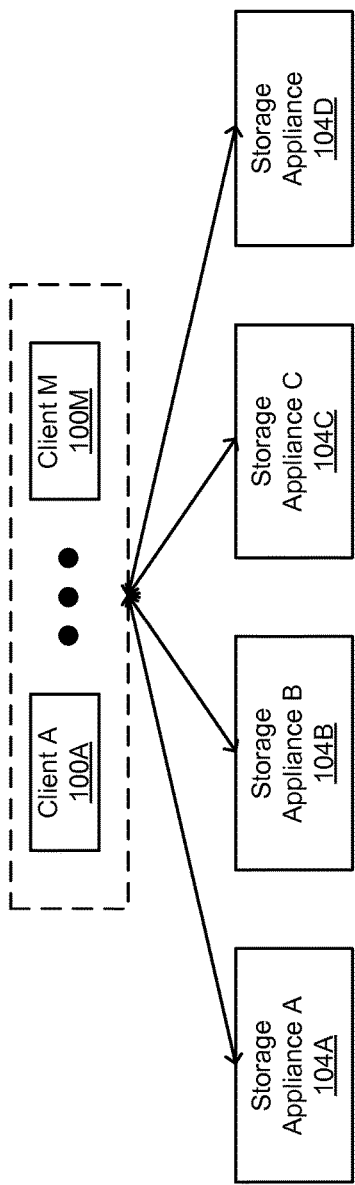
Figure 1D:
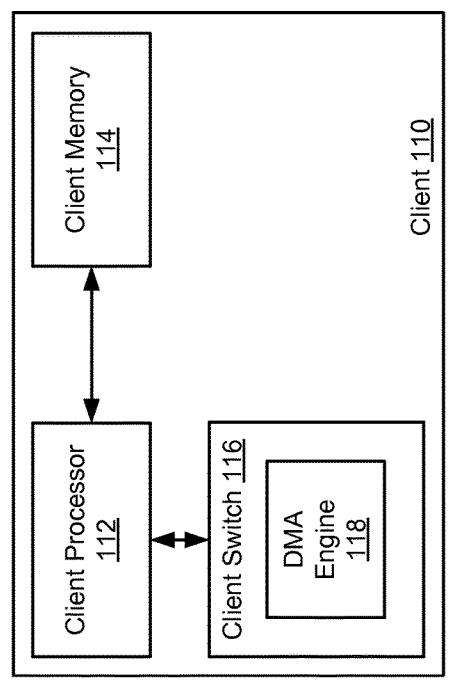
Figure 2A:
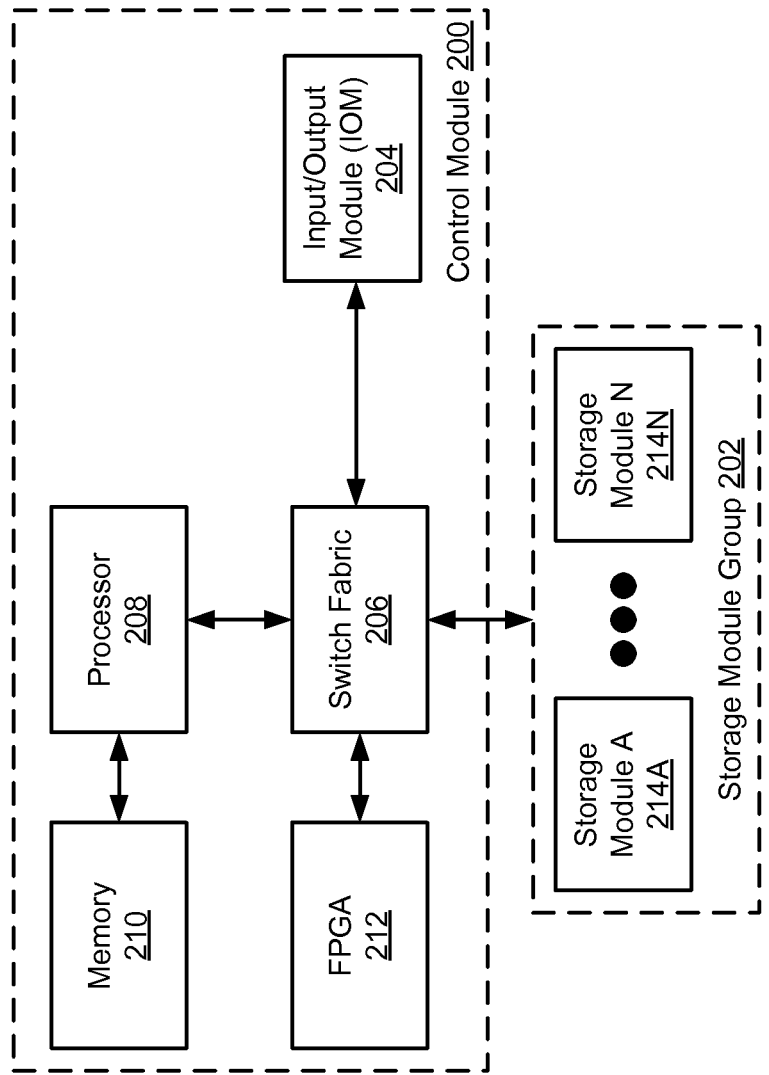
FIGS. 2A-2D show storage appliances in accordance with one or more embodiments of the technology.

In one embodiment of the technology, the PCIe Fabric includes root complexes and endpoints which are connected via switches (e.g., client switch (116) in FIG. 1D and switches within the switch fabric, e.g., switch fabric (206) in FIG. 2A). In one embodiment of the technology, an endpoint is a device other than a root complex or a switch that can originate PCI transactions (e.g., read request, write request) or that is a target of PCI transactions.

In one embodiment of the technology, a single client and a single storage appliance may be considered part of a single PCIe Fabric. In another embodiment of the technology, any combination of one or more clients and one or more storage appliances may be considered part of a single PCIe Fabric. Further, if the individual components within the storage appliance communicate using PCIe, and individual components in the client (see FIG. 1D) communicate using PCIe, then all the components in the storage appliance and the client may be considered part of a single PCIe Fabric. Those skilled in the art will appreciate that various embodiments of the technology may be implemented using another type of fabric without departing from the technology.

Continuing with FIG. 1A, in one embodiment of the technology, the storage appliance (102) is a system that includes both volatile and persistent storage and is configured to service read requests and/or write requests from one or more clients (100A, 100M). Various embodiments of the storage appliance (102) are described below in FIGS. 2A-2D.

Referring to FIG. 1B, FIG. 1B shows a system in which clients (100A, 100M) are connected to multiple storage appliances (104A, 104B, 104C, 104D) arranged in a mesh configuration (denoted as storage appliance mesh (104) in FIG. 1B). As shown in FIG. 1B, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, each of the clients (100A, 100M) may be directly connected to one or more storage appliances (104A, 104B, 104C, 104D) in the storage appliance mesh (104). Those skilled in the art will appreciate that the storage appliance mesh may be implemented using other mesh configurations (e.g., partially connected mesh) without departing from the technology.

Referring to FIG. 1C, FIG. 1C shows a system in which clients (100A, 100M) are connected to multiple storage appliances (104A, 104B, 104C, 104D) arranged in a fan-out configuration. In this configuration, each client (100A, 100M) is connected to one or more of the storage appliances (104A, 104B, 104C, 104D); however, there is no communication between the individual storage appliances (104A, 104B, 104C, 104D).

Referring to FIG. 1D, FIG. 1D shows a client in accordance with one or more embodiments of the technology. As shown in FIG. 1D, the client (110) includes a client processor (112), client memory (114), and a client switch (116). Each of these components is described below.

In one embodiment of the technology, the client processor (112) is a group of electronic circuits with a single core or multiple cores that are configured to execute instructions. In one embodiment of the technology, the client processor (112) may be implemented using a Complex Instruction Set (CISC) Architecture or a Reduced Instruction Set (RISC) Architecture. In one or more embodiments of the technology, the client processor (112) includes a root complex (as defined by the PCIe protocol) (not shown). In one embodiment of the technology, if the client (110) includes a root complex (which may be integrated into the client processor (112)) then the client memory (114) is connected to the client processor (112) via the root complex. Alternatively, the client memory (114) is directly connected to the client processor (112) using another point-to-point connection mechanism. In one embodiment of the technology, the client memory (114) corresponds to any volatile memory including, but not limited to, Dynamic Random-Access Memory (DRAM), Synchronous DRAM, SDR SDRAM, and DDR SDRAM.

In one embodiment of the technology, the client memory (114) includes one or more of the following: a submission queue for the client processor and a completion queue for the client processor. In one embodiment of the technology, the storage appliance memory includes one or more submission queues for client processors visible to a client through the fabric, and the client memory includes one or more completion queues for the client processor visible to the storage appliance through the fabric. In one embodiment of the technology, the submission queue for the client processor is used to send commands (e.g., read request, write request) to the client processor. In one embodiment of the technology, the completion queue for the client processor is used to signal the client processor that a command it issued to another entity has been completed. Embodiments of the technology may be implemented using other notification mechanisms without departing from the technology.

In one embodiment of the technology, the client switch (116) includes only a single switch. In another embodiment of the technology, the client switch (116) includes multiple interconnected switches. If the client switch (116) includes multiple switches, each switch may be connected to every other switch, may be connected to a subset of the switches in the switch fabric, or may only be connected to one other switch. In one embodiment of the technology, each of the switches in the client switch (116) is a combination of hardware and logic (implemented, for example, using integrated circuits) (as defined by the protocol(s) the switch fabric implements) that is configured to permit data and messages to be transferred between the client (110) and the storage appliances (not shown).

In one embodiment of the technology, when the clients (100A, 100M) implement one or more of the following protocols PCI, PCIe, or PCI-X, the client switch (116) is a PCI switch.

In such embodiments, the client switch (116) includes a number of ports, where each port may be configured as a transparent bridge or a non-transparent bridge. Ports implemented as transparent bridges allow the root complex to continue discovery of devices (which may be other root complexes, switches, PCI bridges, or endpoints) connected (directly or indirectly) to the port. In contrast, when a root complex encounters a port implemented as a non-transparent bridge, the root complex is not able to continue discovery of devices connected to the port—rather, the root complex treats such a port as an endpoint.

When a port is implemented as a non-transparent bridge, devices on either side of the non-transparent bridge may only communicate using a mailbox system and doorbell interrupts (implemented by the client switch). The doorbell interrupts allow a processor on one side of the non-transparent bridge to issue an interrupt to a processor on the other side of the non-transparent bridge. Further, the mailbox system includes one or more registers that are readable and writeable by processors on either side of the switch fabric. The aforementioned registers enable processors on either side of the client switch to pass control and status information across the non-transparent bridge.

In one embodiment of the technology, in order to send a PCI transaction from a device on one side of the non-transparent bridge to a device on the other side of the non-transparent bridge, the PCI transaction must be addressed to the port implementing the non-transparent bridge. Upon receipt of the PCI transaction, the client switch performs an address translation (either using a direct address translation mechanism or a look-up table based translation mechanism). The resulting address is then used to route the packet towards the appropriate device on the other side of the non-transparent bridge.

In one embodiment of the technology, the client switch (116) is configured such that at least a portion of the client memory (114) is directly accessible to the storage appliance. Said another way, a storage appliance on one side of the client switch may directly access, via the client switch, client memory on the other side of the client switch.

In one embodiment of the technology, the client switch (116) includes a DMA engine (118). In one embodiment of the technology, the DMA engine (118) may be programmed by either the client processor or a storage appliance connected to the client switch. As discussed above, the client switch (116) is configured such that at least a portion of the client memory (114) is accessible to the storage appliance or storage modules. Accordingly, the DMA engine (118) may be programmed to read data from an address in the portion of the client memory that is accessible to the storage appliance and directly write a copy of such data to memory in the storage appliance or storage modules. Further, the DMA engine (118) may be programmed to read data from the storage appliance and directly write a copy of such data to an address in the portion of the client memory that is accessible to the storage appliance.

In one embodiment of the technology, the DMA engine (118) supports multicasting. In such embodiments, a processor in the storage appliance (see FIG. 2A) may create a multicast group, where each member of the multicast group corresponds to a unique destination address in memory on the storage appliance. Each member of the multicast group is associated with a descriptor that specifies: (i) the destination address; (ii) the source address; (iii) the transfer size field; and (iv) a control field. The source address for each of the descriptors remains constant while the destination address changes for each descriptor. Once the multicast group is created, any data transfer through the switch targeting the multicast group address, including a transfer initiated by a DMA engine, places an identical copy of the data in all of the destination addresses associated with the multicast group. In one embodiment of the technology, the switch processes all of the multicast group descriptors in parallel.

Continuing with the discussion of FIG. 1D, those skilled in the art will appreciate that while FIG. 1D shows a client switch (116) located in the client (110), the client switch (116) may be located external to the client without departing from the technology. Further, those skilled in the art will appreciate that the DMA engine (118) may be located external to the client switch (116) without departing from the technology.

Figure 1E:
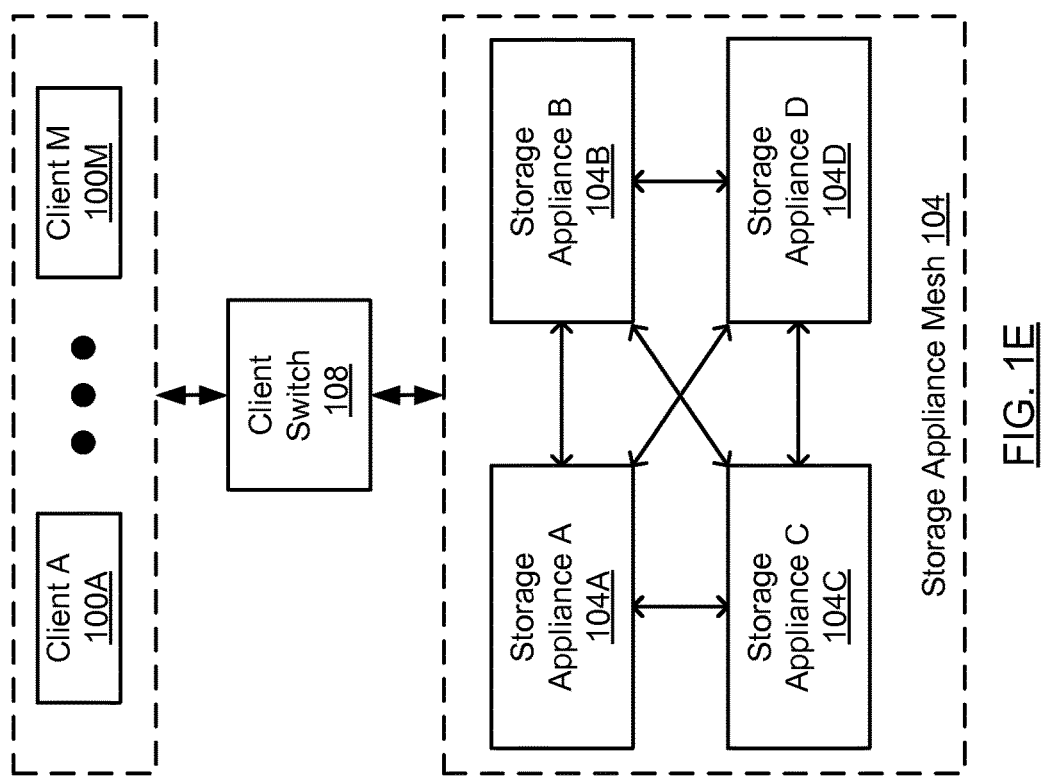

Referring FIG. 1E, FIG. 1E shows a system in which clients (100A, 100M) are connected, via a client switch (108), to multiple storage appliances (104A, 104B, 104C, 104D) arranged in a mesh configuration (denoted as storage appliance mesh (104) in FIG. 1E). In the embodiment shown in FIG. 1E, each client (100A, 100M) does not include its own client switch—rather, all of the clients share a client switch (108). As shown in FIG. 1E, the storage appliance mesh (104) is shown in a fully-connected mesh configuration—that is, every storage appliance (104A, 104B, 104C, 104D) in the storage appliance mesh (104) is directly connected to every other storage appliance (104A, 104B, 104C, 104D) in the storage appliance mesh (104). In one embodiment of the technology, the client switch (108) may be directly connected to one or more storage appliances (104A, 104B, 104C, 104D) in the storage appliance mesh (104). Those skilled in the art will appreciate that storage appliance mesh may be implemented using other mesh configurations (e.g., partially connected mesh) without departing from the technology.

Though not shown in FIG. 1E, each client may include its own client switch (as shown in FIG. 1D) but may be connected to the storage appliance mesh (104) using a switch fabric (defined below).

Those skilled in the art will appreciate that while FIGS. 1A-1E show storage appliances connected to a limited number of clients, the storage appliances may be connected to any number of clients without departing from the technology. Those skilled in the art will appreciate that while FIGS. 1A-1E show various system configurations, the technology is not limited to the aforementioned system configurations. Further, those skilled in the art will appreciate that the clients (regardless of the configuration of the system) may be connected to the storage appliance(s) using a switch fabric (not shown) (described below) without departing from the technology.

FIGS. 2A-2D show embodiments of storage appliances in accordance with one or more embodiments of the technology. Referring to FIG. 2A, the storage appliance includes a control module (200) and a storage module group (202). Each of these components is described below. In general, the control module (200) is configured to manage the servicing of read and write requests from one or more clients. In particular, the control module is configured to receive requests from one or more clients via the IOM (discussed below), to process the request (which may include sending the request to the storage module), and to provide a response to the client after the request has been serviced. Additional details about the components in the control module are included below. Further, the operation of the control module with respect to servicing read and write requests is described below with reference to FIGS. 4A-7C.

Continuing with the discussion of FIG. 2A, in one embodiment of the technology, the control module (200) includes an Input/Output Module (IOM) (204), a switch fabric (206), a processor (208), a memory (210), and, optionally, a Field Programmable Gate Array (FPGA) (212). In one embodiment of the technology, the IOM (204) is the physical interface between the clients (100A, 100M in FIGS. 1A-1E) and the other components in the storage appliance. The IOM supports one or more of the following protocols: PCI, PCIe, PCI-X, Ethernet (including, but not limited to, the various standards defined under the IEEE 802.3a-802.3bj), Infiniband, and Remote Direct Memory Access (RDMA) over Converged Ethernet (RoCE). Those skilled in the art will appreciate that the IOM may be implemented using protocols other than those listed above without departing from the technology.

Continuing with the discussion of FIG. 2A, the switch fabric (206) includes only a single switch. In another embodiment of the technology, the switch fabric (206) includes multiple interconnected switches. If the switch fabric (206) includes multiple switches, each switch may be connected to every other switch, may be connected to a subset of switches in the switch fabric, or may only be connected to one other switch in the switch fabric. In one embodiment of the technology, each of the switches in the switch fabric (206) is a combination of hardware and logic (implemented, for example, using integrated circuits) (as defined by the protocol(s) the switch fabric implements) that is configured to connect various components together in the storage appliance and to route packets (using the logic) between the various connected components. In one embodiment of the technology, the switch fabric (206) is physically connected to the TOM (204), processor (208), storage module group (202), and, if present, the FPGA (212). In one embodiment of the technology, all inter-component communication in the control module (200) (except between the processor (208) and memory (210)) passes through the switch fabric (206). Further, all communication between the control module (200) and the storage module group (202) passes through the switch fabric (206). In one embodiment of the technology, the switch fabric (206) is implemented using a PCI protocol (e.g., PCI, PCIe, PCI-X, or another PCI protocol). In such embodiments, all communication that passes through the switch fabric (206) uses the corresponding PCI protocol.

In one embodiment of the technology, if the switch fabric implements a PCI protocol, the switch fabric (206) includes a port for the processor (or, more specifically, a port for the root complex integrated in the processor (208) or for the root complex connected to the processor), one or more ports for storage modules (214A, 214N) (see FIGS. 3A-3B) in the storage module group (202), a port for the FPGA (212) (if present), and a port for the TOM (204). In one or more embodiments of the technology, each of the aforementioned ports may be configured as a transparent bridge or a non-transparent bridge (as discussed above). Those skilled in the art will appreciate that while the switch fabric (206) has been described with respect to a PCI implementation, the switch fabric (206) may be implemented using other protocols without departing from the technology.

In one embodiment of the technology, at least one switch in the switch fabric (206) is configured to implement multicasting. More specifically, in one embodiment of the technology, the processor (208) is configured to generate a multicast group where the multicast group includes two or more members with each member specifying an address in the memory (210) and/or in the storage modules (214A, 214N). When the multicast group is created, the multicast group is associated with a multicast address. In order to implement the multicasting, at least one switch in the switch fabric is configured that when a write specifying the multicast address as the destination address is received, the switch is configured to generate a new write for each member in the multicast group and issue the writes to the appropriate address in the storage appliance. In one embodiment of the technology, the address for each write generated by the switch is determined by adding a particular offset to the multicast address.

Continuing with FIG. 2A, the processor (208) is a group of electronic circuits with a single core or multiple cores that are configured to execute instructions. In one embodiment of the technology, the processor (208) may be implemented using a Complex Instruction Set (CISC) Architecture or a Reduced Instruction Set (RISC) Architecture. In one or more embodiments of the technology, the processor (208) includes a root complex (as defined by the PCIe protocol). In one embodiment of the technology, if the control module (200) includes a root complex (which may be integrated into the processor (208)) then the memory (210) is connected to the processor (208) via the root complex. Alternatively, the memory (210) is directly connected to the processor (208) using another point-to-point connection mechanism. In one embodiment of the technology, the memory (210) corresponds to any volatile memory including, but not limited to, Dynamic Random-Access Memory (DRAM), Synchronous DRAM, SDR SDRAM, and DDR SDRAM.

In one embodiment of the technology, the processor (208) is configured to create and update an in-memory data structure (not shown), where the in-memory data structure is stored in the memory (210). In one embodiment of the technology, the in-memory data structure includes mappings (direct or indirect) between logical addresses and physical storage addresses in the set of storage modules. In one embodiment of the technology, the logical address is an address at which the data appears to reside from the perspective of the client. In one embodiment of the technology, the logical address is (or includes) a hash value generated by applying a hash function (e.g. SHA-1, MD-5, etc.) to an n-tuple.

In one embodiment of the technology, the n-tuple is <object ID, offset ID>, where the object ID defines a file and the offset ID defines a location relative to the starting address of the file. In another embodiment of the technology, the n-tuple is <object ID, offset ID, birth time>, where the birth time corresponds to the time when the file (identified using the object ID) was created. Alternatively, the logical address may include a logical object ID and a logical byte address, or a logical object ID and a logical address offset. In another embodiment of the technology, the logical address includes an object ID and an offset ID. Those skilled in the art will appreciate that multiple logical addresses may be mapped to a single physical address and that the logical address is not limited to the above embodiments.

Figure 3A:
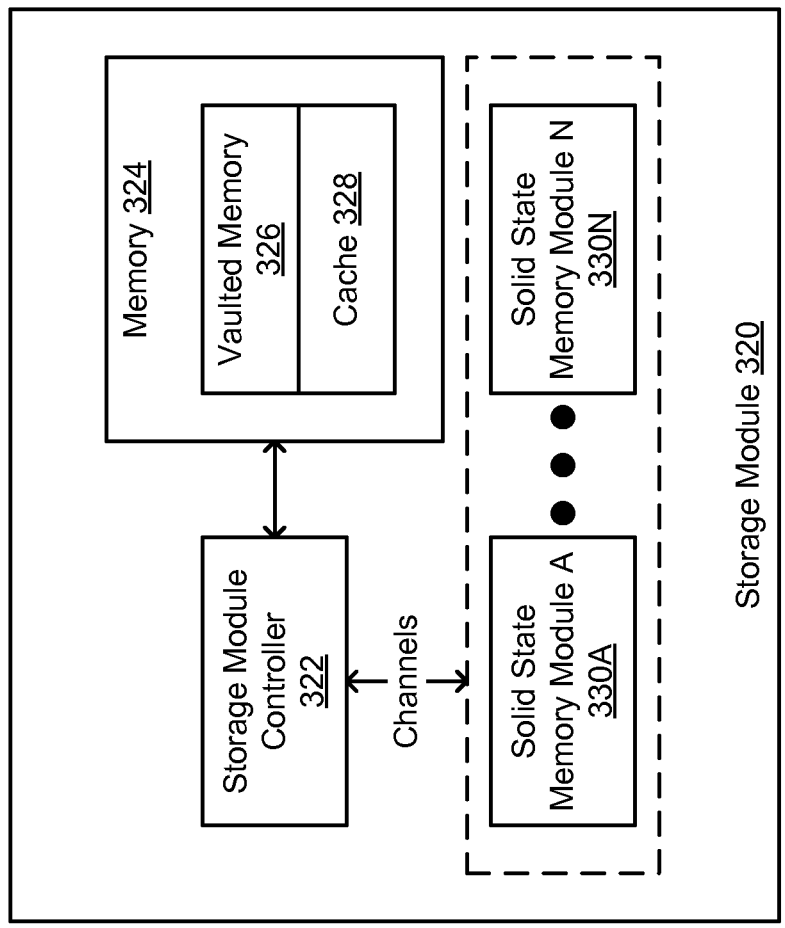

In one embodiment of the technology, the physical address may correspond to (i) a location in the memory (210), (ii) a location in the vaulted memory (e.g., 326 in FIG. 3A), or (iii) a location in a solid state memory module (e.g., 330 in FIG. 3B). In one embodiment of the technology, the in-memory data structure may map a single hash value to multiple physical addresses if there are multiple copies of the data in the storage appliance.

In one embodiment of the technology, the memory (210) includes one or more of the following: a submission queue for the processor, a completion queue for the processor, a submission queue for each of the storage modules in the storage appliance, and a completion queue for each of the storage modules in the storage appliance. In one embodiment of the technology, the submission queue for the processor is used to send commands (e.g., read request, write request) to the processor. In one embodiment of the technology, the completion queue for the processor is used to signal the processor that a command it issued to another entity has been completed. The submission and completion queues for the storage modules function in a similar manner.

In one embodiment of the technology, the processor (via the switch fabric) is configured to offload various types of processing to the FPGA (212). In one embodiment of the technology, the FPGA (212) includes functionality to calculate checksums for data that is being written to the storage module(s) and/or data that is being read from the storage module(s). Further, the FPGA (212) may include functionality to calculate P and/or Q parity information for purposes of storing data in the storage module(s) using a RAID scheme (e.g., RAID 2-RAID 6) and/or functionality to perform various calculations necessary to recover corrupted data stored using a RAID scheme (e.g., RAID 2-RAID 6). In one embodiment of the technology, the storage module group (202) includes one or more storage modules (214A, 214N) each configured to store data. Storage modules are described below in FIGS. 3A-3B.

In one embodiment of the technology, the processor (208) is configured to program one or more DMA engines in the system. For example, the processor (208) is configured to program the DMA engine in the client switch (see FIG. 1D). The processor (208) may also be configured to program the DMA engine in the storage module (see FIGS. 3A-3B). In one embodiment of the technology, programming the DMA engine in the client switch may include creating a multicast group and generating descriptors for each of the members in the multicast group.

Figure 2B:
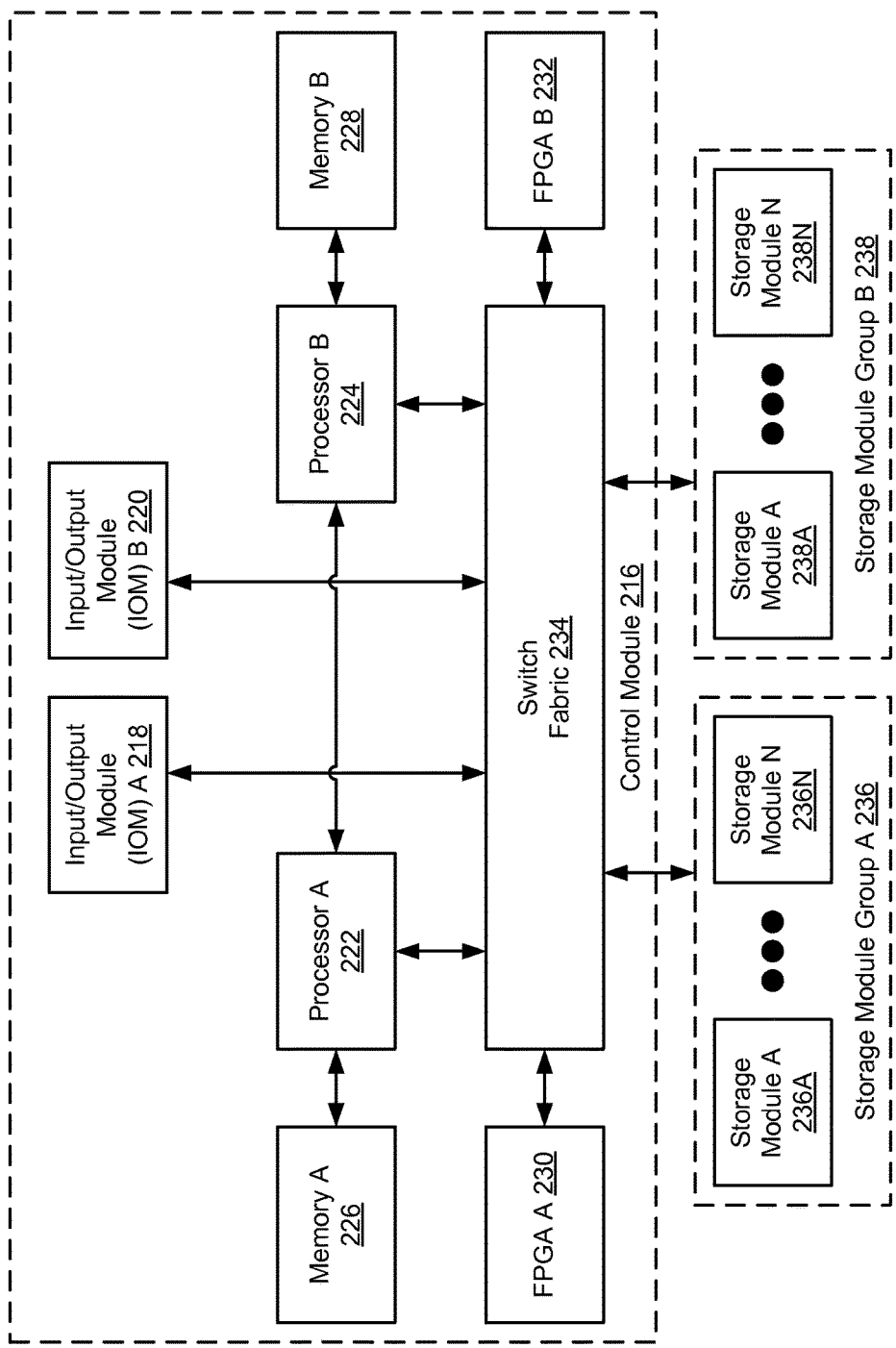

Turning to FIG. 2B, FIG. 2B shows a storage appliance in accordance with one or more embodiments of the technology. The storage appliance includes a control module (216) and at least two storage module groups (236, 238). The control module (216) includes a switch fabric (234), which is directly connected to IOM A (218), IOM B (220), processor A (222), processor B (224), (if present) FPGA A (230), (if present) FPGA B (232), storage modules (236A, 236N) in storage module group A (236) and storage modules (238A, 238N) in storage module group B (238). All communication between the aforementioned components (except between processor A (222) and processor B (224)) passes through the switch fabric (234). In one embodiment of the technology, processors (222, 224) within the control module (216) are able to directly communicate using, for example, point-to-point interconnect such as Intel® QuickPath Interconnect. Those skilled in the art will appreciate that other point-to-point communication mechanisms may be used to permit direct communication between the processors (222, 224) without departing from the technology.

Continuing with FIG. 2B, in one embodiment of the technology, the control module (216) is substantially similar to the control module (200) in FIG. 2A. In one embodiment of the technology, the switch fabric (234) is substantially similar to the switch fabric (206) in FIG. 2A. In one embodiment of the technology, each processor (222, 224) is substantially similar to the processor (208) in FIG. 2A. In one embodiment of the technology, the memory (226, 228) is substantially similar to the memory (210) in FIG. 2A. In one embodiment of the technology, the IOMs (218, 220) are substantially similar to the IOM (204) in FIG. 2A. In one embodiment of the technology, the FPGAs (230, 232) are substantially similar to the FPGA (212) in FIG. 2A. Finally, the storage module groups (236, 238) are substantially similar to the storage module group (202) in FIG. 2A.

In one embodiment of the technology, the two IOMs (218, 220) in the control module (216) double the I/O bandwidth for the control module (216) (over the I/O bandwidth of a control module with a single IOM). Moreover, the addition of a second IOM (or additional IOMs) increases the number of clients that may be connected to a given control module and, by extension, the number of clients that can be connected to a storage appliance. In one embodiment of the technology, the use of the switch fabric (234) to handle communication between the various connected components (described above) allows each of the processors (222, 224) to directly access (via the switch fabric (234)) all FPGAs (230, 232) and all storage modules (236A, 236N, 238A, 238N) connected to the switch fabric (234).

Figure 2C:
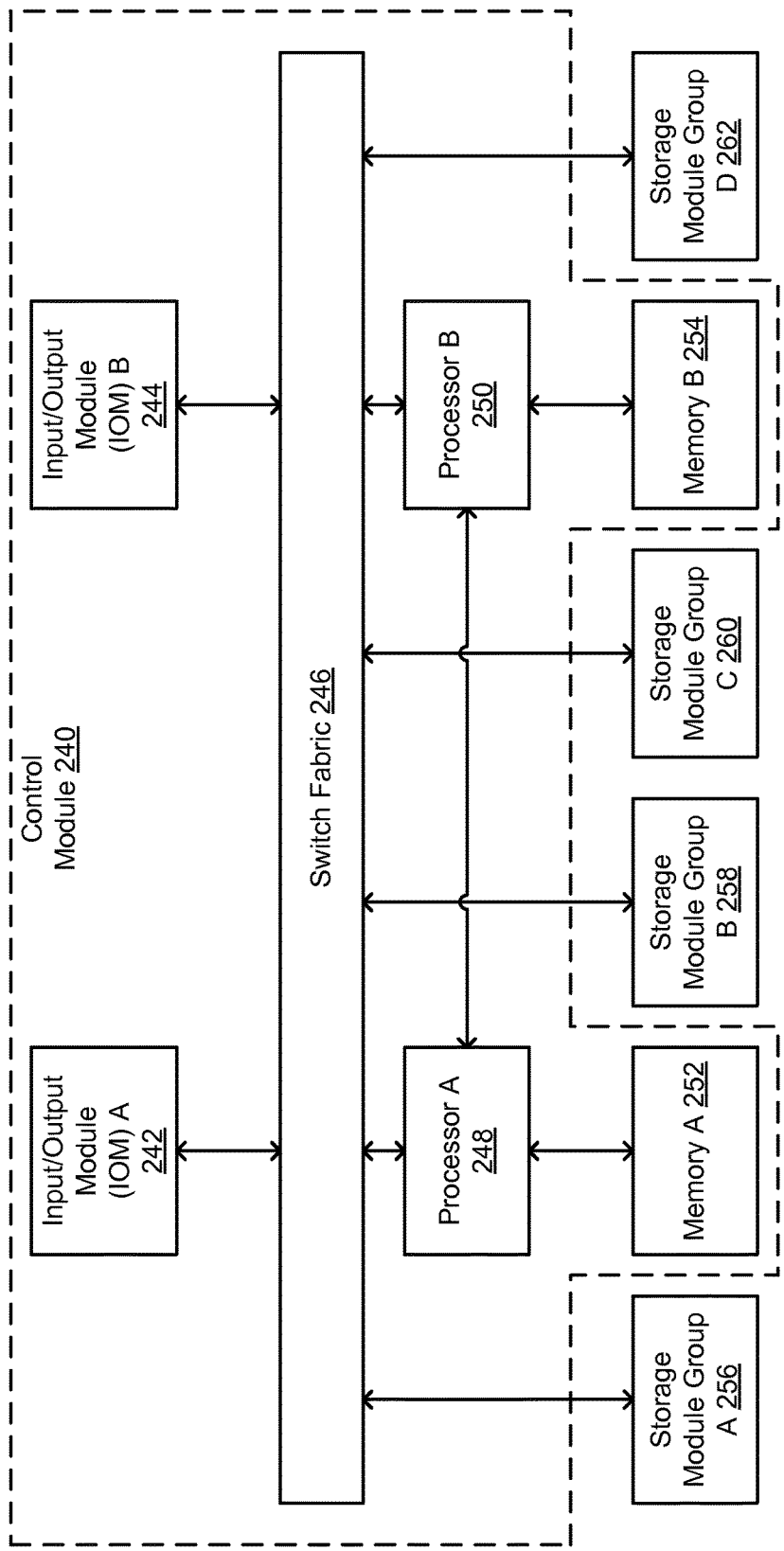

Referring to FIG. 2C, FIG. 2C shows a storage appliance that includes a control module (240) connected (via a switch fabric (246)) to multiple storage modules (not shown) in the storage module groups (256, 258, 260, 262). As shown in FIG. 2C, the control module (240) includes two IOMs (242, 244), two processors (248, 250), and memory (252, 254). In one embodiment of the technology, all components in the control module (240) communicate via the switch fabric (246). In addition, the processors (248, 250) may communicate with each other using the switch fabric (246) or a direct connection (as shown in FIG. 2C). In one embodiment of the technology, the processors (248, 250) within the control module (240) are able to directly communicate using, for example, a point-to-point interconnect such as Intel® QuickPath Interconnect. Those skilled in the art will appreciate that other point-to-point communication mechanisms may be used to permit direct communication between the processors (248, 250) without departing from the technology.

In one embodiment of the technology, processor A (248) is configured to primarily handle requests related to the storage and retrieval of data from storage module groups A and B (256, 258) while processor B (250) is configured to primarily handle requests related to the storage and retrieval of data from storage module groups C and D (260, 262). However, the processors (248, 250) are configured to communicate (via the switch fabric (246)) with all of the storage module groups (256, 258, 260, 262). This configuration enables the control module (240) to spread the processing of I/O requests between the processors and/or provides built-in redundancy to handle the scenario in which one of the processors fails.

Continuing with FIG. 2C, in one embodiment of the technology, the control module (240) is substantially similar to the control module (200) in FIG. 2A. In one embodiment of the technology, the switch fabric (246) is substantially similar to the switch fabric (206) in FIG. 2A. In one embodiment of the technology, each processor (248, 250) is substantially similar to the processor (208) in FIG. 2A. In one embodiment of the technology, the memory (252, 254) is substantially similar to the memory (210) in FIG. 2A. In one embodiment of the technology, the IOMs (242, 244) are substantially similar to the IOM (204) in FIG. 2A. Finally, the storage module groups (256, 258, 260, 262) are substantially similar to the storage module group (202) in FIG. 2A.

Figure 2D:
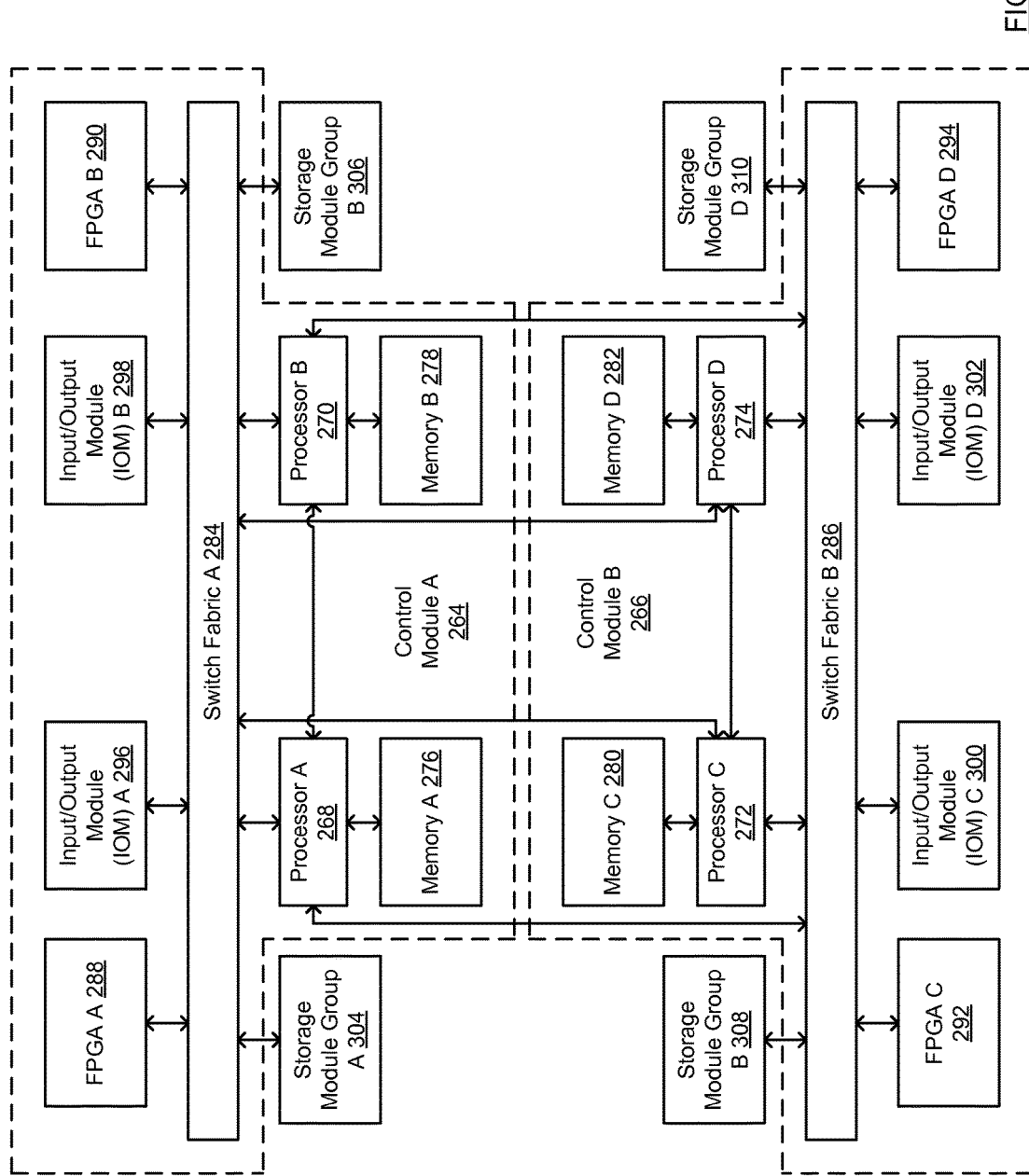

Referring to FIG. 2D, FIG. 2D shows a storage appliance that includes two control modules (264, 266). Each control module includes IOMs (296, 298, 300, 302), processors (268, 270, 272, 274), memory (276, 278, 280, 282), and FPGAs (if present) (288, 290, 292, 294). Each of the control modules (264, 266) includes a switch fabric (284, 286) through which components within the control modules communicate.

In one embodiment of the technology, processors (268, 270, 272, 274) within a control module may directly communicate with each other using, for example, a point-to-point interconnect such as Intel® QuickPath Interconnect. Those skilled in the art will appreciate that other point-to-point communication mechanisms may be used to permit direct communication between the processors (268, 270, 272, 274) without departing from the technology. In addition, processors (268, 270) in control module A may communicate with components in control module B via a direct connection to the switch fabric (286) in control module B. Similarly, processors (272, 274) in control module B may communicate with components in control module A via a direct connection to the switch fabric (284) in control module A.

In one embodiment of the technology, each of the control modules is connected to various storage modules (denoted by storage module groups (304, 306, 308, 310)). As shown in FIG. 2D, each control module may communicate with storage modules connected to the switch fabric in the control module. Further, processors in control module A (264) may communicate with storage modules connected to control module B (266) using switch fabric B (286). Similarly, processors in control module B (266) may communicate with storage modules connected to control module A (264) using switch fabric A (284).

The interconnection between the control modules allows the storage control to distribute I/O load across the storage appliance regardless of which control module receives the I/O request. Further, the interconnection of control modules enables the storage appliance to process a larger number of I/O requests. Moreover, the interconnection of control modules provides built-in redundancy in the event that a control module (or one or more components therein) fails.

With respect to FIGS. 2B-2D, in one or more embodiments of the technology, the in-memory data structure is mirrored across the memories in the control modules. In such cases, the processors in the control modules issue the necessary commands to update all memories within the storage appliance such that the in-memory data structure is mirrored across all the memories. In this manner, any processor may use its own memory to determine the location of a data (as defined by an n-tuple, discussed above) in the storage appliance. This functionality allows any processor to service any I/O request in regards to the location of the data within the storage module. Further, by mirroring the in-memory data structures, the storage appliance may continue to operate when one of the memories fails.

Those skilled in the art will appreciate that while FIGS. 2A-2D show control modules connected to a limited number of storage modules, the control module may be connected to any number of storage modules without departing from the technology. Those skilled in the art will appreciate that while FIGS. 2A-2D show various configurations of the storage appliance, the storage appliance may be implemented using other configurations without departing from the technology.

FIGS. 3A-3B show a storage module in accordance with one or more embodiments of the technology. Referring to FIG. 3A, the storage module (320) includes a storage module controller (322), memory (324), and one or more solid state memory modules (330A, 330N). Each of these components is described below.

In one embodiment of the technology, the storage module controller (322) is configured to receive requests to read from and/or write data to one or more control modules. Further, the storage module controller (322) is configured to service the read and write requests using the memory (324) and/or the solid state memory modules (330A, 330N). Though not shown in FIG. 3A, the storage module controller (322) may include a DMA engine, where the DMA engine is configured to read data from the memory (324) or from one of the solid state memory modules (330A, 330N) and write a copy of the data to a physical address in client memory (114 in FIG. 1D). Further, the DMA engine may be configured to write data from the memory (324) to one or more of the solid state memory modules. In one embodiment of the technology, the DMA engine is configured to be programmed by the processor (e.g., 208 in FIG. 2A). Those skilled in the art will appreciate that the storage module may include a DMA engine that is external to the storage module controller without departing from the technology.

In one embodiment of the technology, the memory (324) corresponds to any volatile memory including, but not limited to, Dynamic Random-Access Memory (DRAM), Synchronous DRAM, SDR SDRAM, and DDR SDRAM.

In one embodiment of the technology, the memory (324) may be logically or physically partitioned into vaulted memory (326) and cache (328). In one embodiment of the technology, the storage module controller (322) is configured to write out the entire contents of the vaulted memory (326) to one or more of the solid state memory modules (330A, 330N) in the event of notification of a power failure (or another event in which the storage module may lose power) in the storage module. In one embodiment of the technology, the storage module controller (322) is configured to write the entire contents of the vaulted memory (326) to one or more of the solid state memory modules (330A, 330N) between the time of the notification of the power failure and the actual loss of power to the storage module. In contrast, the content of the cache (328) is lost in the event of a power failure (or another event in which the storage module may lose power).

In one embodiment of the technology, the solid state memory modules (330A, 330N) correspond to any data storage device that uses solid-state memory to store persistent data. In one embodiment of the technology, solid-state memory may include, but is not limited to, NAND Flash memory, NOR Flash memory, Magnetic RAM Memory (M-RAM), Spin Torque Magnetic RAM Memory (ST-MRAM), Phase Change Memory (PCM), or any other memory defined as a non-volatile Storage Class Memory (SCM).

Referring to FIG. 3B, in one embodiment of the technology if the solid state memory module (330) includes flash memory (e.g., NAND flash memory, NOR flash memory, etc.) then a portion of flash memory may be operating in single-level cell (SLC) mode (332) and another portion of the flash memory may be operating in multi-level cell (MLC) mode. More specifically, in one embodiment of the technology, the flash memory is MLC flash memory and the storage module controller includes functionality to designate certain blocks as SLC blocks (i.e., the SLC mode portion (332)) and other blocks as MLC blocks (i.e., MLC mode portion (334)). Based on the above designation, the storage model controller may interact with the SLC blocks as if there were SLC flash memory even though the flash memory is in-fact MLC flash memory.

The proportion of flash memory that is operating in SLC mode (i.e., the size of the SLC mode portion (332)) as compared to the proportion of flash memory that is operation in MLC mode (i.e., the size of the MLC mode portion 334)) may vary based on the implementation of the technology. For example, in one embodiment of the technology, the amount of flash memory operating in SLC mode is at least equal to the size of the vaulted memory (326) (as shown in FIG. 3A) with the remainder of the flash memory operating in MLC mode.

In one embodiment of the technology, the following storage locations are part of a unified address space: (i) the portion of the client memory accessible via the client switch, (ii) the memory in the control module, (iii) the memory in the storage modules, and (iv) the solid state memory modules. Accordingly, from the perspective of the processor in the storage appliance, the aforementioned storage locations (while physically separate) appear as a single pool of physical addresses. Said another way, the processor may issue read and/or write requests for data stored at any of the physical addresses in the unified address space. The aforementioned storage locations may be referred to as storage fabric that is accessible using the unified address space.

In one embodiment of the technology, a unified address space is created, in part, by the non-transparent bridge in the client switch which allows the processor in the control module to "see" a portion of the client memory. Accordingly, the processor in the control module may perform read and/or write requests in the portion of the client memory that it can "see".

Figure 4D:
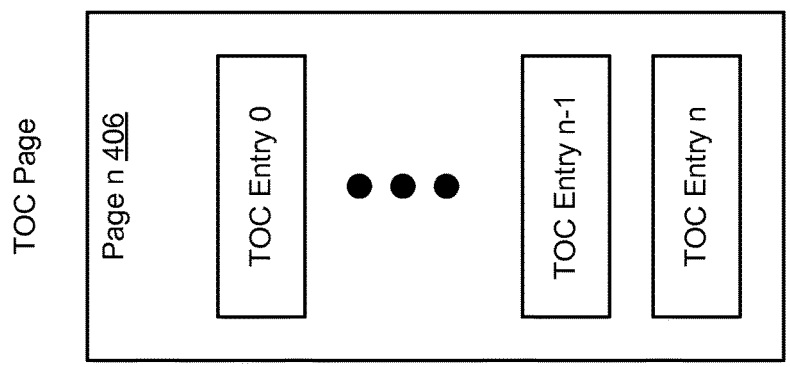
FIG. 4D shows a TOC page in accordance with one or more embodiments of the technology.
Figure 4C:
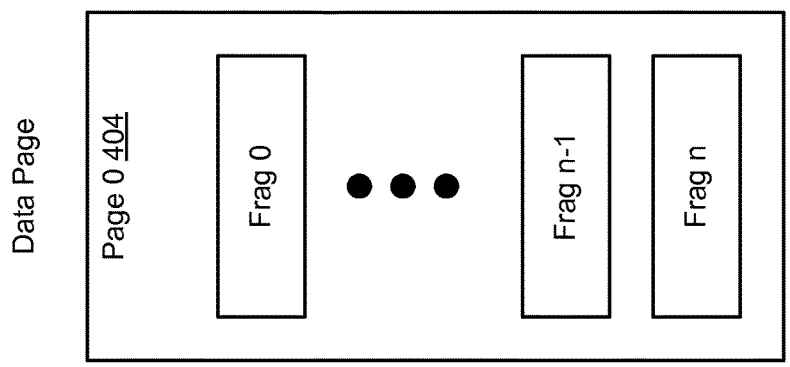
FIG. 4C shows a data page in accordance with one or more embodiments of the technology.
Figure 4B:
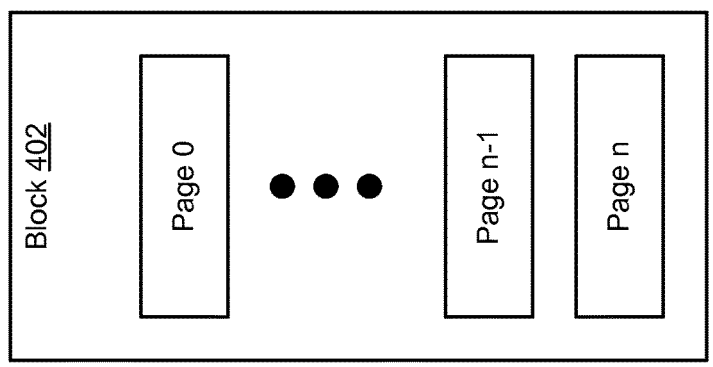
FIG. 4B shows a block in accordance with one or more embodiments of the technology.
Figure 4A:
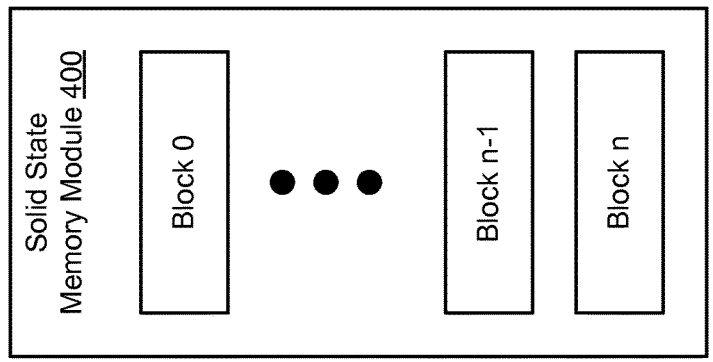
FIG. 4A shows a storage module in accordance with one or more embodiments of the technology.

FIG. 4A shows a storage module in accordance with one or more embodiments of the technology. The solid state memory module (400) includes one or more blocks. In one embodiment of the technology, a block is the smallest erasable unit of storage within the solid state memory module (400).

FIG. 4B shows a block in accordance with one or more embodiments of the technology. More specifically, each block (402) includes one or more pages. In one embodiment of the technology, a page is the smallest addressable unit for read and program operations (including the initial writing to a page) in the solid state memory module. In one embodiment of the technology, rewriting a page within a block requires the entire block to be rewritten. In one embodiment of the technology, each page within a block is either a Frag Page (see FIG. 4C) or a Table of Contents (TOC) Page (see FIG. 4D).

FIG. 4C shows a data page (404) in accordance with one or more embodiments of the technology. In one embodiment of the technology, the data page (404) includes one or more frags. In one embodiment of the technology, a frag corresponds to a finite amount of user data. Further, the frags within a given page may be of a uniform size or of a non-uniform size. Further, frags within a given block may be of a uniform size or of a non-uniform size. In one embodiment of the technology, a given frag may be less than the size of a page, may be exactly the size of a page, or may extend over one or more pages. In one embodiment of the technology, a data page only includes frags. In one embodiment of the technology, each frag includes user data (i.e., data provided by the client for storage in the storage appliance). For purposes of this description, the term "frag" and "user data" are used interchangeably.

FIG. 4D shows a TOC page in accordance with one or more embodiments of the technology. In one embodiment of the technology, the TOC page (406) includes one or more TOC entries, where each of the TOC entries includes metadata for a given frag. In addition, the TOC page (406) may include a reference to another TOC page in the block (402). In one embodiment of the technology, a TOC page only includes TOC entries (and, optionally, a reference to another TOC page in the block), but does not include any frags. In one embodiment of the technology, each TOC entry corresponds to a frag (see FIG. 4C) in the block (402). The TOC entries only correspond to frags within the block. Said another way, the TOC page is associated with a block and only includes TOC entries for frags in that block. In one embodiment of the technology, the last page that is not defective in each block within each of the solid state memory modules is a TOC page.

Figure 4E:
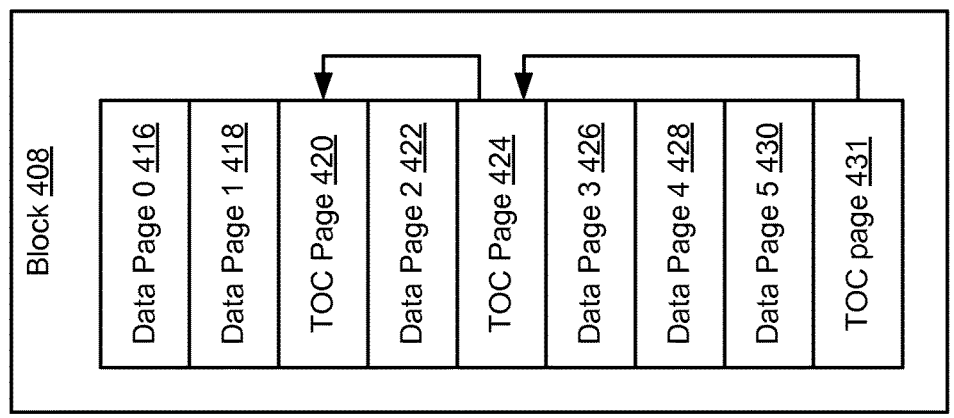
FIG. 4E shows a block in accordance with one or more embodiments of the technology.

FIG. 4E shows a block in accordance with one or more embodiments of the technology. More specifically, FIG. 4E shows a block (408) that includes TOC pages (420, 424, 431) and data pages (416, 418, 422, 428, 428, 430). In one embodiment of the technology, the block (408) is conceptually filled from "top" to "bottom." Further, TOC pages are generated and stored once the accumulated size of the TOC entries for the frags in the data pages equal the size of a page. Turning to FIG. 4E, for example, data page 0 (416) and data page 1 (418) are stored in the block (408). The corresponding TOC entries (not shown) for the frags (not shown) in data page 0 (416) and data page 1 (418) have a total cumulative size equal to the size of a page in the block. Accordingly, a TOC page (414) is generated (using the TOC entries corresponding to frags in the block) and stored in the block (408). Frag page 2 (420) is subsequently written to the block (408). Because the TOC entries corresponding to the frags (not shown) in data page 2 (420) have a total cumulative size equal to the size of a page in the block, TOC page (412) is created and stored in the block (408). Further, because there is already a TOC page in the block (408), TOC page (412) also includes a reference to TOC page (414).

This process is repeated until there is only one page remaining in the block (408) to fill. At this point, a TOC page (410) is created and stored in the last page of the block (408). Those skilled in the art will appreciate that the total cumulative size of the TOC entries in the TOC page (410) may be less than the size of the page. In such cases, the TOC page may include padding to address the difference between the cumulative size of the TOC entries and the page size. Finally, because there are other TOC pages in the block (408), TOC page (410) includes a reference to one other TOC page (412).

As shown in FIG. 4E, the TOC pages are linked from the "bottom" of the block to "top" of the page, such that the TOC page may be obtained by following a reference from a TOC page that is below the TOC page. For example, TOC page (412) may be accessed using the reference in TOC page (410).

Those skilled in the art will appreciate that while block (408) only includes data pages and TOC pages, block (408) may include pages (e.g., a page that includes parity data) other than data pages and TOC pages without departing from the technology. Such other pages may be located within the block and, depending on the implementation, interleaved between the TOC pages and the data pages.

FIG. 4F shows a TOC entry in accordance with one or more embodiments of the technology. In one embodiment of the technology, each TOC entry (430) includes metadata for a frag (and in particular the user data in the frag) and may include one or more of the following fields: (i) object ID (432), which identifies the object (e.g., file) being stored; (ii) the birth time (434), which specifies the time (e.g., the processor clock value of the processor in the control module) at which the frag corresponding to the TOC entry was written to the vaulted memory; (iii) offset ID (436), which identifies the starting point of the user data in the frag relative to the beginning of the object (identified by the object ID); (iv) fragment size (438), which specifies the size of the frag; (v) page ID (440), which identifies the page in the block in which the frag is stored; (vi) byte (442), which identifies the starting location of the frag in the page (identified by the page ID); (vii) logical length (444), which specifies the non-compressed length of the user data in the frag; (viii) type (446), which specifies the type of user data in the frag (e.g., badpage, data, snapshot, pool); (ix) kind (448), which specifies whether the frag is valid user data or trim (which indicates that the frag may be erased when the solid state memory module performs garbage collection); and (x) reserved (450), which corresponds to space in the TOC entry that may be used to store other user data.

In one embodiment of the technology, the <object ID, offset ID> or <object ID, offset ID, birth time> identify user data that is provided by the client. Further, the <object ID, offset ID> or <object ID, offset ID, birth time> are used by the client to identify particular user data, while the storage appliance uses a physical address(es) to identify user data within the storage appliance. Those skilled in the art will appreciate that the client may provide a logical address instead of the object ID and offset ID.

Those skilled in the art will appreciate that the TOC entry may include additional or fewer fields than shown in FIG. 4F without departing from the technology. Further, the fields in the TOC entry may be arranged in a different order and/or combined without departing from the technology. In addition, while the fields in the TOC entry shown in FIG. 4F appear to all be of the same size, the size of various fields in the TOC entry may be non-uniform, with the size of any given field varying based on the implementation of the TOC entry.

Figure 4G:
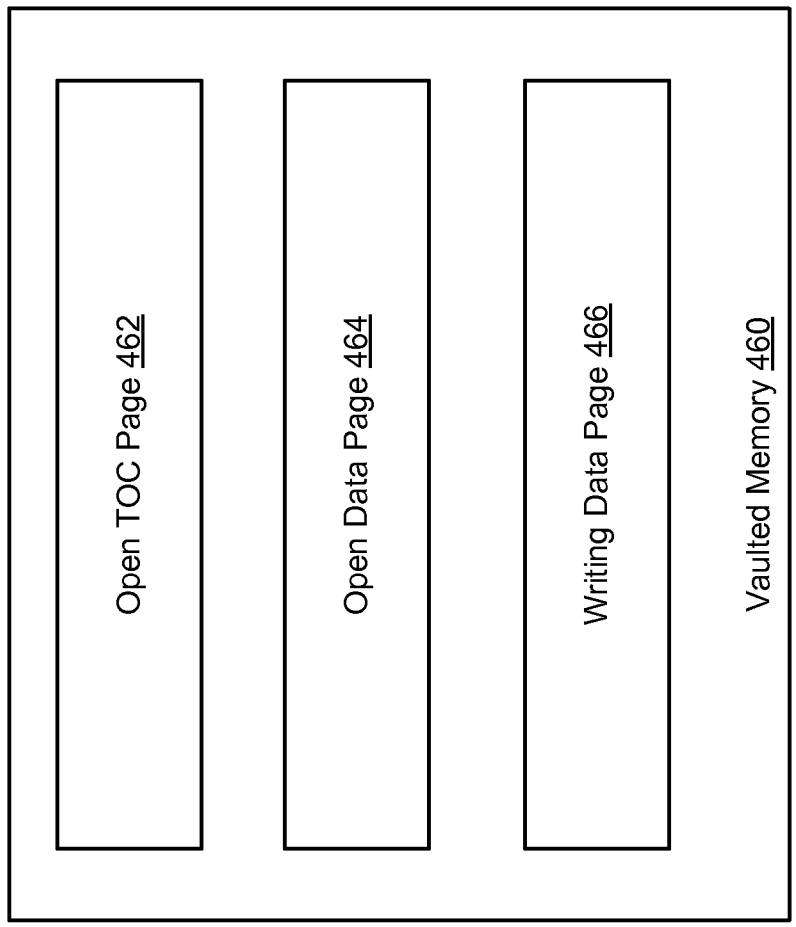
FIG. 4G shows vaulted memory content in accordance with one or more embodiments of the technology.

FIG. 4G shows vaulted memory content in accordance with one or more embodiments of the technology. Portions of the memory within the vaulted memory (460) may be allocated into segments that are the same size as the pages that are ultimately stored in the persistent storage (see e.g. FIG. 4E). In one embodiment of the technology, the aforementioned segments may include: (i) an open TOC page (462), (ii) an open data page (464), and (iii) a writing data page (466). While the following section describes the technology with respect to a single open TOC page, a single open data page, and a single writing data page, embodiments of the technology may be implemented using multiple open TOC pages, multiple open data pages, and/or multiple writing pages without departing from the technology. The vaulted memory may include other segments without departing from the technology.

The open TOC page (462) is a portion of memory that is used to store TOC entries prior to such TOC entries being written to the appropriate solid state memory module. More specifically, TOC entries are stored in the open TOC page within the vaulted memory and, at some point in time, the open TOC page becomes full (i.e., it can no longer store any additional TOC entries). When this occurs, the contents of the open TOC page is written to an appropriate block in a storage memory module as a TOC page (see e.g., FIG. 4D). Additional detail about the open TOC page is shown in FIG. 4H.

The open data page (464) is a portion of memory that is used to store frags prior to such frags being written to the appropriate solid state memory module. Additional detail about the open data page is shown in FIG. 4H. The writing data page (466) is a portion of memory that includes frags that are currently being written to the appropriate solid state memory module. The designations of the aforementioned portions of memory may change over time. For example, a certain portion of memory may initially be designated as an open data page. Once this portion of memory is full (i.e., no more frags can be stored in the portion of memory), the designation of the portion of memory is changed to a writing data page. The contents of the writing data page are then written out to the appropriate block in the solid state memory module as a data page (see e.g., FIG. 4C). Additional detail about use of the open TOC page, the open data page, and the writing data page may be found in FIGS. 6A-7G below.

FIG. 4H shows an open TOC page in accordance with one or more embodiments of the technology. The open TOC page (470) includes a TOC bit (476) where the state of the TOC bit (e.g., either 0 or 1) reflects that the portion of memory is a TOC page. The open TOC page (470) also includes a provisional physical address (478), which corresponds to a location in the block (in the solid state memory module) in which the TOC page will ultimately be stored but does not necessarily correspond to the actual location in the block in which the TOC page will be stored. More specifically, the location in which a TOC page is stored in a given block is determined in accordance with FIG. 6C. As such, the time at which the TOC page is being generated (i.e., at the time that TOC entries are being stored in the open TOC page), the final location of the TOC page is not known. However, the block in which the TOC page will be stored is known. Accordingly, the provisional physical address is selected as an address within the block in which the TOC page will be stored. The TOC bit (476) and the provisional physical address (478) may be collective referred to as a tag (472). The tag (472) may be stored in the open TOC page prior to other content being stored in the open TOC page. Referring to FIG. 4H, the open TOC page also includes one or more TOC entries, which may be collectively referred to the payload.

FIG. 4I shows an open data page in accordance with one or more embodiments of the technology. The open data page (480) includes a TOC bit (486), where the state of the TOC bit (e.g., either 0 or 1) reflects that the portion of memory is a data page. The open data page (480) also includes a physical address (488), which corresponds to a location in the block (in the solid state memory module) in which the data page will ultimately be stored. The TOC bit (486) and the physical address (488) may be collectively referred to as a tag (482). The tag (482) may be stored in the open data page prior to other content being stored in the open data page. Referring to FIG. 4I, the open data page also includes one or more frags, which may be collectively referred to the payload (484).

Figure 5A:
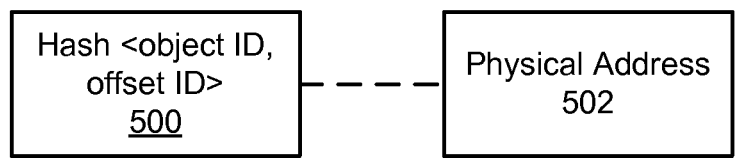
FIGS. 5A and 5B show various data structures in accordance with one or more embodiments of the technology.

FIG. 5A shows a data structure in accordance with one or more embodiments of the technology. As discussed above, the memory in the control module includes an in-memory data structure. In one embodiment of the technology, the in-memory data structure includes a mapping between an n-tuple (e.g., <object ID, offset ID> (500), <object ID, offset ID, birth time> (not shown)) and a physical address (502) of the frag in a solid state memory module. In one embodiment of the technology, the mapping is between a hash of the n-tuple and the physical address. In one embodiment of the technology, the physical address for a frag is defined as the following n-tuple: <storage module, channel, chip enable, LUN, plane, block, page, byte>. The aforementioned tuple corresponds to a logical representation of the content of the physical address. The aforementioned content may be encoded, for example, into a 48-bit physical address that is used by various components in the storage appliance (see e.g., FIGS. 1A-3B).

Figure 5B:
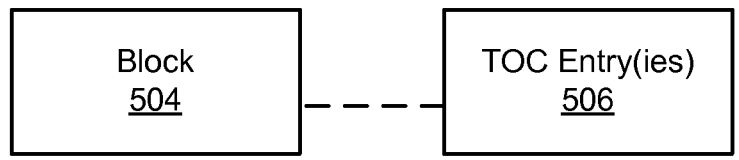

FIG. 5B shows a data structure in accordance with one or more embodiments of the technology. In one embodiment of the technology, the control module tracks the number of TOC entries (506) per block (504). More specifically, each time a frag is written to vaulted memory, a TOC entry for the frag is created. The control module tracks with which block the newly created TOC entry is associated and uses this information to generate TOC pages. For example, the control module uses the aforementioned information to determine whether the cumulative size of all TOC entries associated with a given block, which have not been written to a TOC page, equal a page size in the block. If the cumulative size of all TOC entries associated with a given block, which have not been written to a TOC page, equal a page size in the block, then the control module may generate a TOC page using the aforementioned entries and initiate the writing of the TOC page to a storage module (see e.g., FIG. 6C).

Figure 6A:
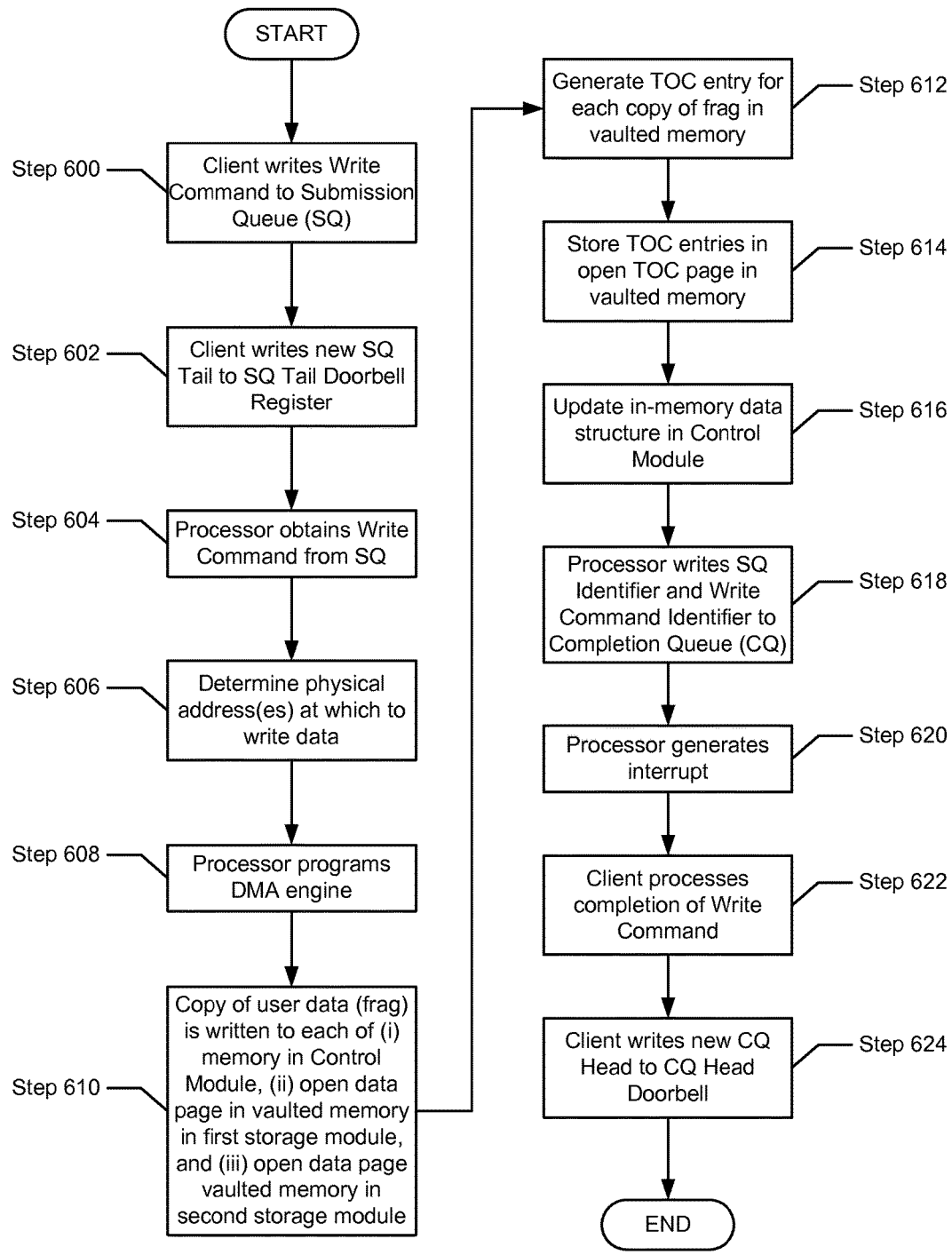
FIGS. 6A-6C show flowcharts in accordance with one or more embodiments of the technology.
Figure 6B:
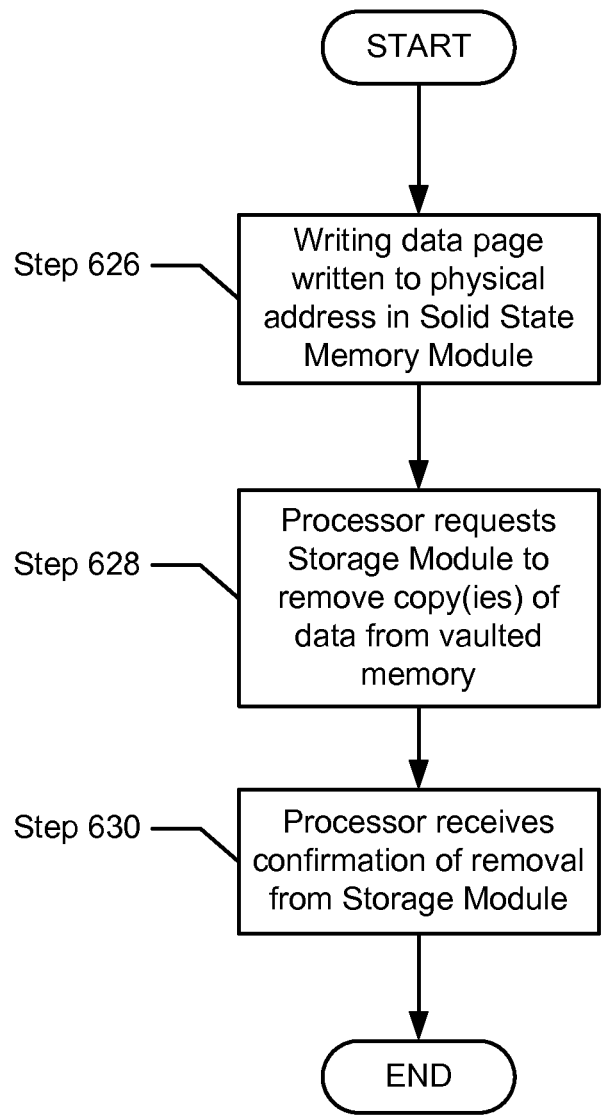
Figure 6C:
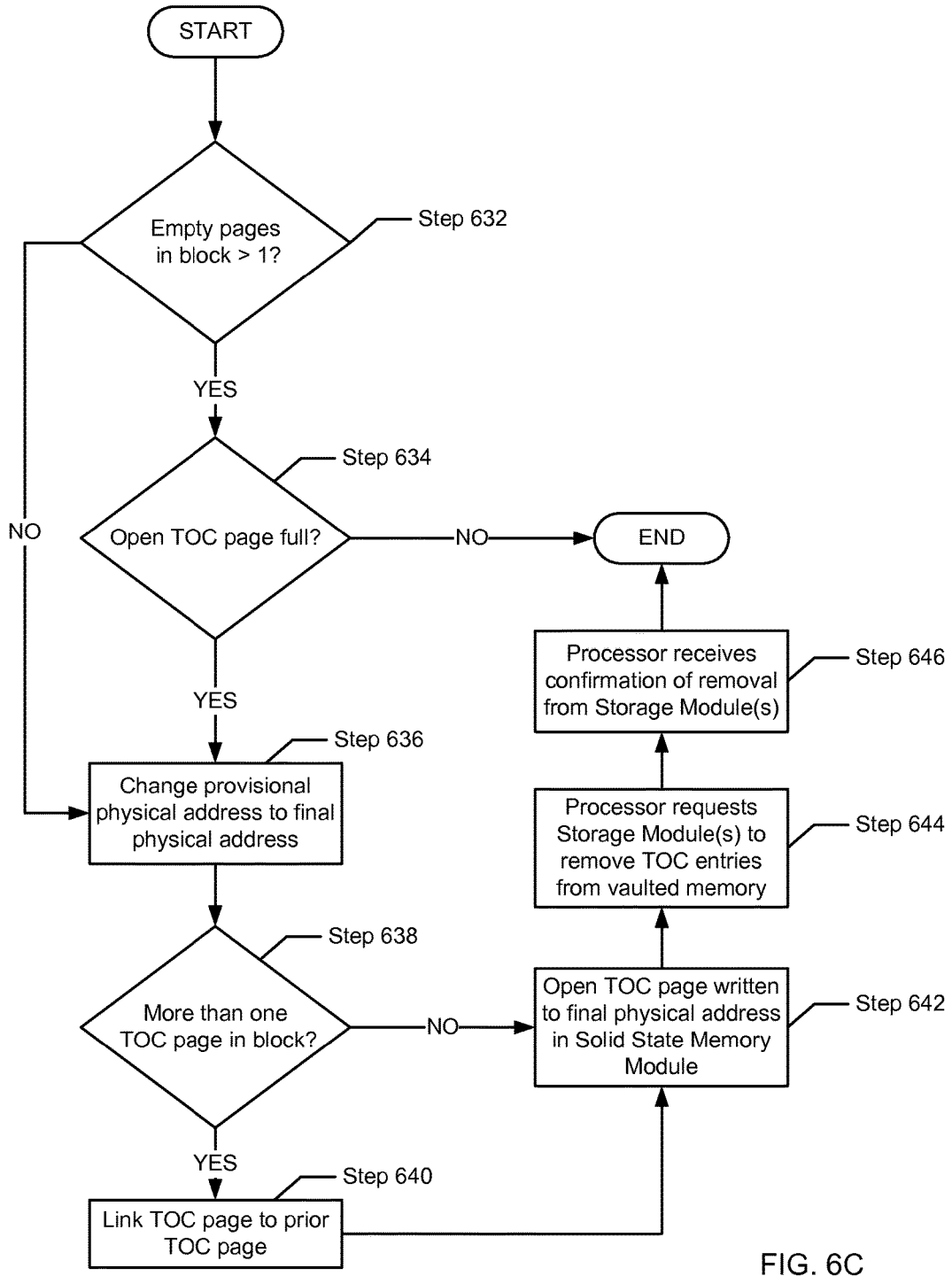

FIGS. 6A-6C show flowcharts in accordance with one or more embodiments of the technology. More specifically, FIGS. 6A-6C show a method for storing user data in a storage appliance in accordance with one or more embodiments of the technology. While the various steps in the flowchart are presented and described sequentially, one of ordinary skill will appreciate that some or all of the steps may be executed in different orders, may be combined or omitted, and some or all of the steps may be executed in parallel. In one embodiment of the technology, the steps shown in FIG. 6A may be performed in parallel with the steps shown in FIG. 6B and the steps shown in FIG. 6C. Further, the steps shown in FIG. 6B may be performed in parallel with the steps shown in FIG. 6C.

Referring to FIG. 6A, in step 600, the client writes a write command (write request) to the submission queue (SQ) of the processor in a control module (208 in FIG. 2A). In one embodiment of the technology, the write command specifies the logical address (which may also be referred to as a "source address") of the user data in the client memory. In one embodiment of the technology, the write command may specify the user data using <object ID, offset ID>. In one embodiment of the technology, the write command passes through at least the client switch and the switch fabric prior to reaching the SQ of the processor.

In step 602, client writes a new SQ tail to the SQ Tail doorbell register. In one embodiment of the technology, by writing to the SQ Tail doorbell register, the client notifies the processor that there is a new command to process in its SQ.

In step 604, the processor obtains the write command from the SQ. In step 606, the processor determines the physical address(es) at which to write the user data (as part of a frag). In one embodiment of the technology, the physical address(es) corresponds to a location in the solid state memory module. In one embodiment of the technology, the processor selects two physical addresses in which to write copies of the user data, where each of the physical addresses is in a separate solid state memory module.

As discussed above, the frags are written to an open data page in the vaulted memory prior to being written to the solid state memory module and each physical address may be specified as <storage module, channel, chip enable, LUN, plane, block, page, byte>. Thus, the physical addresses for each of the frags stored in the open data page may have the same values for all portions of the physical address except for the <byte> value. Accordingly, in one embodiment of the technology, the physical address selected in step 606 may be determined using the physical address (486) in the tag (482) of the open data page. Said another way, once a determination is made that a given frag is to be written to a particular solid state memory module, the physical address at which to store the frag may be determined based on the physical address in the tag in the open data page in the vaulted memory. In such cases, the physical address at which to write the frag may be determined by obtaining the physical address in the tag and then modifying the <byte> portion of this physical address. (See e.g., FIGS. 7A-7G).

In step 608, the processor programs the DMA engine to issue a write to a multicast address. In one embodiment of the technology, the multicast address is associated with a multicast group, where the multicast group specifies a first memory location in the memory in the control module, a second memory location in an open data page in the first vaulted memory, and a third memory location in an open data page in the second vaulted memory. In one embodiment of the technology, the first vaulted memory is located in the same storage module as the solid state memory module that includes the physical address specified by the processor. In one embodiment of the technology, the second vaulted memory is located in a different storage module to protect against failure of the first storage module. In one embodiment of the technology, there is one memory location selected for each physical address identified by the processor in step 606.

In step 610, the DMA engine reads the user data from the source address in client memory, and writes the data to the multicast address as directed by the control module. In one embodiment of the technology, a switch in the switch fabric is associated with the multicast address. Upon receipt of the address, the switch performs the necessary translation on the multicast address to obtain three addresses—one to each of the aforementioned memory locations. The switch subsequently sends copies of the user data to the three memory locations. Those skilled in the art will appreciate that the particular switch which implements multicast may vary based on the implementation of the switch fabric. In this embodiment, there is only one write issued between the client and the storage appliance.

In another embodiment of the technology, in Step 608, the processor programs the DMA engine to issue three write requests in parallel—one to each of the aforementioned memory locations. In this embodiment, in Step 610, DMA engine issues the three write requests in parallel. In this embodiment, there are three writes issues between the client and the storage appliance.

Continuing with FIG. 6A, in step 612, a TOC entry is created for each copy of user data stored in vaulted memory. Further, the page and byte specified in each TOC entry correspond to the page and byte portions of the corresponding physical address identified in step 606. Accordingly, while the frag is not written to the physical address in the solid state memory module at the time the corresponding TOC entry is created, the frag (as part of a data page) is intended to be written to the physical address at a later point in time. As discussed above, each of the TOC entries is stored in a TOC page and the TOC page is eventually written to a solid state memory module. However, prior to the creation of the TOC page, the TOC entries are created and temporarily stored in the memory in the control module and in vaulted memory on the solid state memory modules.

Continuing with FIG. 6A, in step 614, the TOC entries created in step 612 are stored in vaulted memory. More specifically, each TOC entry is stored in the open TOC page in the vaulted memory of the storage modules and includes the physical address at which the corresponding frag will be written at a later point in time.

In step 616, the processor updates the in-memory data structure to reflect that three copies of the user data are stored in the storage appliance. The processor may also update the data structure that tracks the TOC entries per block (see FIG. 5). In step 618, the processor writes the SQ Identifier (which identifies the SQ of the processor) and a Write Command Identifier (which identifies the particular write command the client issued to the processor) to the completion queue (CQ) of the client.

In step 620, the processor generates an interrupt for the client processor. In one embodiment of the technology, the processor uses the doorbell interrupts provided by the non-transparent bridge to issue an interrupt to the client processor. In step 622, the client processes the data in its CQ. At this stage, the client has been notified that the write request has been serviced. In step 624, once the client has processed the data at the head of the completion queue, the client writes a new CQ head to the CQ head doorbell. This signifies to the processor the next location in the CQ to use in future notifications to the client.

Referring to FIG. 6B, when an open data page in vaulted memory (see e.g., FIG. 4G, 464) can no longer store any additional frags (i.e., the open data page is full), then the open data page becomes the writing data page. In step 626, the processor in the control module initiates the content of the writing data page to the appropriate location (i.e., the location in the solid state memory module corresponding to the physical address (486) in the tag (482)). In one embodiment of the technology, the processor in the control module programs a DMA engine in the storage module controller to write the writing data page (or the content of the writing data page) to the solid state memory module. In another embodiment of the technology, the storage module controller may initiate the writing of the writing data page to the solid state memory module. Once the writing is complete, the storage module controller may notify the control module.

In step 628, following step 626, the processor in the control module requests that all copies of the user data in vaulted memory that correspond to the user data written to the solid state memory module in step 626 are removed. Said another way, the processor may request that the content of the writing data page be erased from the vaulted memory. In step 630, a confirmation of the removal is sent to the processor in the control module by each of the storage modules that included a writing data page that was erased.

Referring to FIG. 6C, FIG. 6C shows a method that is performed each time a TOC entry is created. In step 632, a determination is made about whether there is more than one empty page remaining in the block. Said another way, a determination is made about whether data pages and TOC pages have been written to all other pages except the last page in the block. If there is more than one empty page remaining in the block, the process proceeds to Step 634; otherwise the process proceeds to step 636. As discussed above, if there is only one empty page in the block in which to write either a data page or a TOC page, then a TOC page must be written to the last page in the block.

In step 634, a determination is made about whether the open TOC page is full (i.e., whether cumulative size of TOC entries prevents additional TOC entries from being stored in the open TOC page) If the open TOC page is full, then the process proceeds to Step 636; otherwise the process ends.

In step 636, the provisional physical address (478) in the open TOC page is changed to a final physical address (i.e., the actual location in the block in which the TOC page (or the content of the TOC page) is to be stored). In one embodiment of the technology, if there is only one empty page in the block in which to write user data and the TOC page is not full, then padding may be added to the open TOC page in order to fill the TOC page. In step 638, a determination is made about whether the block includes another TOC page. If the block includes another TOC page, the process proceeds to step 640; otherwise the process proceeds to step 642. In step 640, a reference to the most recently stored TOC page in the block is included in the TOC page created in step 636 (e.g., TOC page (410) references TOC page (412) in FIG. 4E).

In step 642, the processor initiates the writing of the full TOC page to a solid state memory module (or, more specifically, to the final physical address specified in the TOC page).

In step 644, the processor requests all storage modules that include TOC entries that were included in the TOC page written to the solid state memory module in Step 642 to remove such TOC entries from their respective vaulted memories. Said another way, the processor request that the content of the open TOC page(s) is erased from vaulted memory. In step 646, the processor receives confirmation, from the storage modules, that the aforementioned TOC entries have been removed.

FIGS. 7A-7G show an example of storing user data in a storage appliance in accordance with one or more embodiments of the technology. The example is not intended to limit the scope of the technology.

Figure 7A:
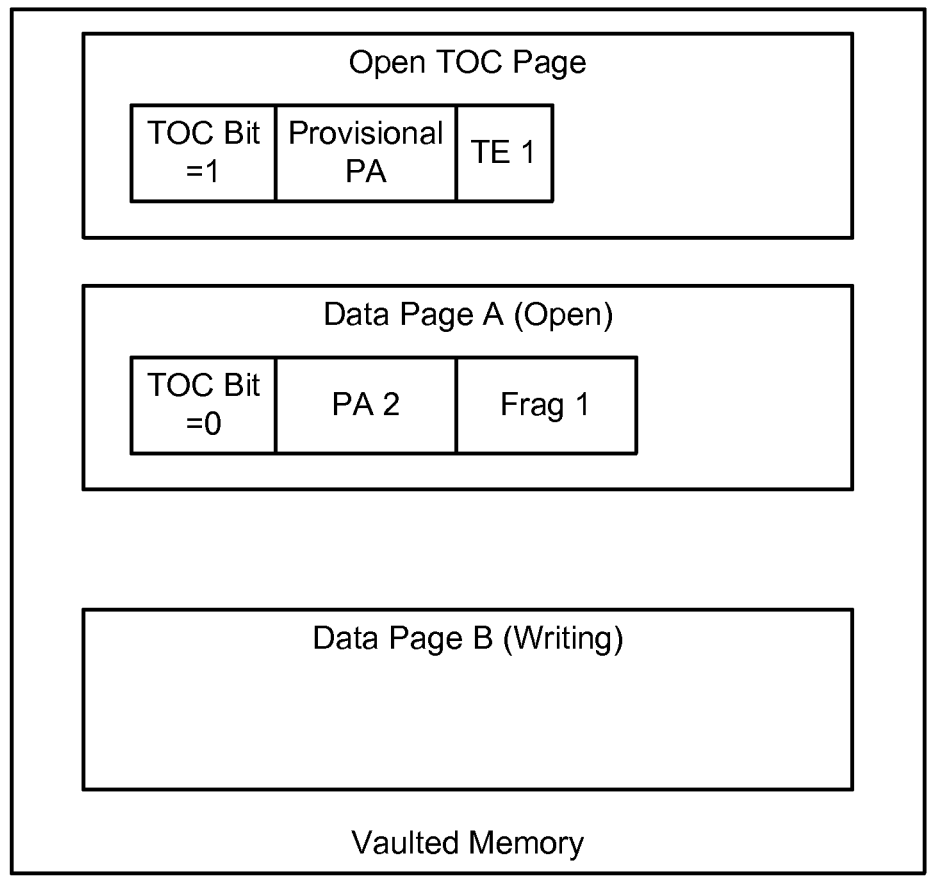
FIGS. 7A-7G show examples in accordance with one or more embodiments of the technology.

Turning to FIG. 7A, consider a scenario in which the vaulted memory includes an open TOC page, Data Page A (initially designated as the open data page) and Data Page B (initially designated as the writing data page). The designation of the pages as "Data Page A" and "Data Page B" are merely included for purposes of this example and are not intended to imply that Data Page A is associated with a higher block number than Data Page B (or vice versa); rather, the pages are designated as such in order to explain various embodiments of the technology. The open TOC page includes a set TOC bit (which indicates that it is a TOC page), a provisional physical address, which corresponds to a physical location in a block in solid state storage (not shown) in which it will ultimately be stored. The open TOC page further includes a TOC entry (TE1). TE 1 is the TOC entry for frag 1 stored in Data Page A.

As shown in FIG. 7A, Data Page A includes a TOC bit which is not set (indicating it is a data page). Data Page A further includes a physical address (PA2) which corresponds to the physical location in the solid state storage at which the data page will ultimately be written. Finally, Data Page A includes frag 1 stored at the <byte> value within the Data Page A, where the <byte> value to the <byte> value specified in TE 1 (see e.g., FIG. 4F, 442).

Figure 7B:
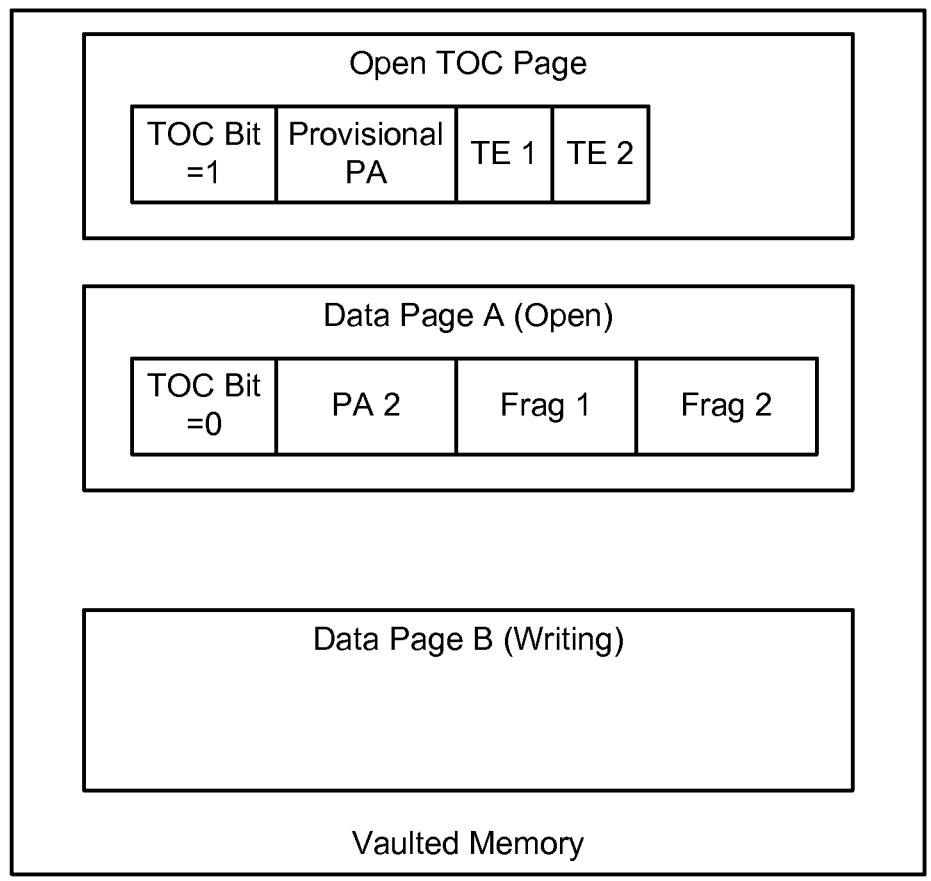

Referring to FIG. 7B, at some later point in time a second frag (frag 2) and a second TOC entry (TE 2) is written to the vaulted memory. FIG. 7B shows the state of the vaulted memory when frag 2 is stored in Data Page A and TE 2 is stored in the open TOC page.

Figure 7C:
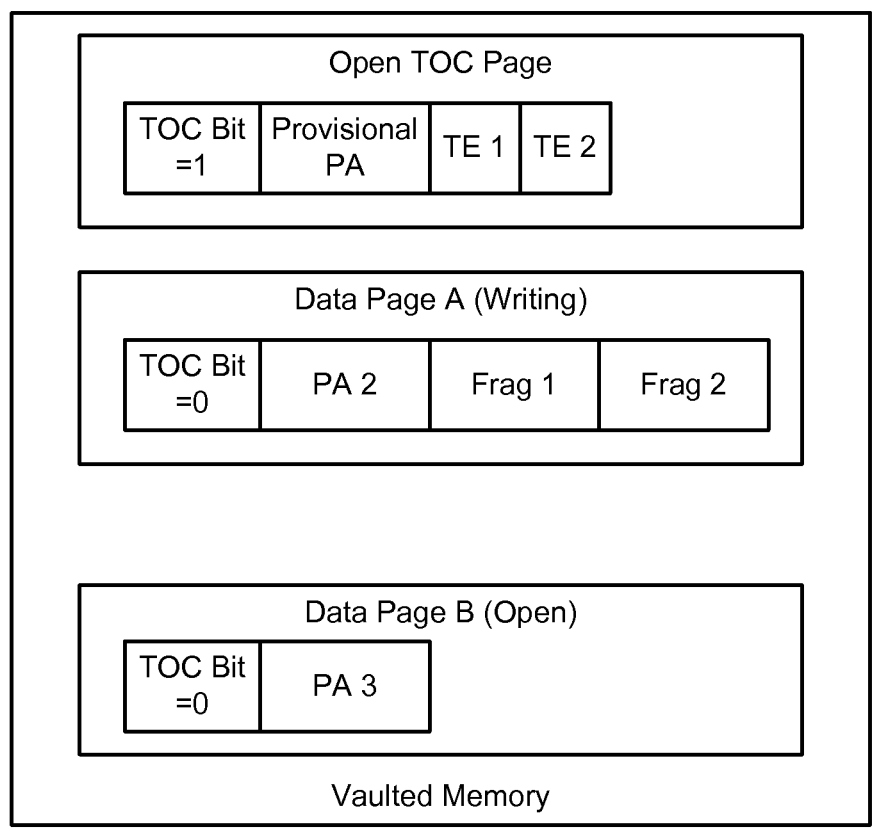

At this stage, this stage the Data Page A is full and, as such, its designation is changed to writing data page. As a result of this change in designation, Data Page B's designation is also changed. Specifically, the designation of Data Page B is transitioned from writing data page to open data page. Accordingly, subsequently received frags may be stored in Data Page B. FIG. 7C shows the state of the vaulted memory after the aforementioned change in designation of the data pages. As shown in FIG. 7C, once the designation of Data Page B has been changed to an open data page, a TOC bit (which is set to 0) and a physical address (PA 3) (which corresponds to the physical location in the solid state memory module) is stored in Data Page B. Once the tag (i.e., the TOC bit and the physical address) have been stored in Data Page B, frags may be stored in Data Page B.

Figure 7D:
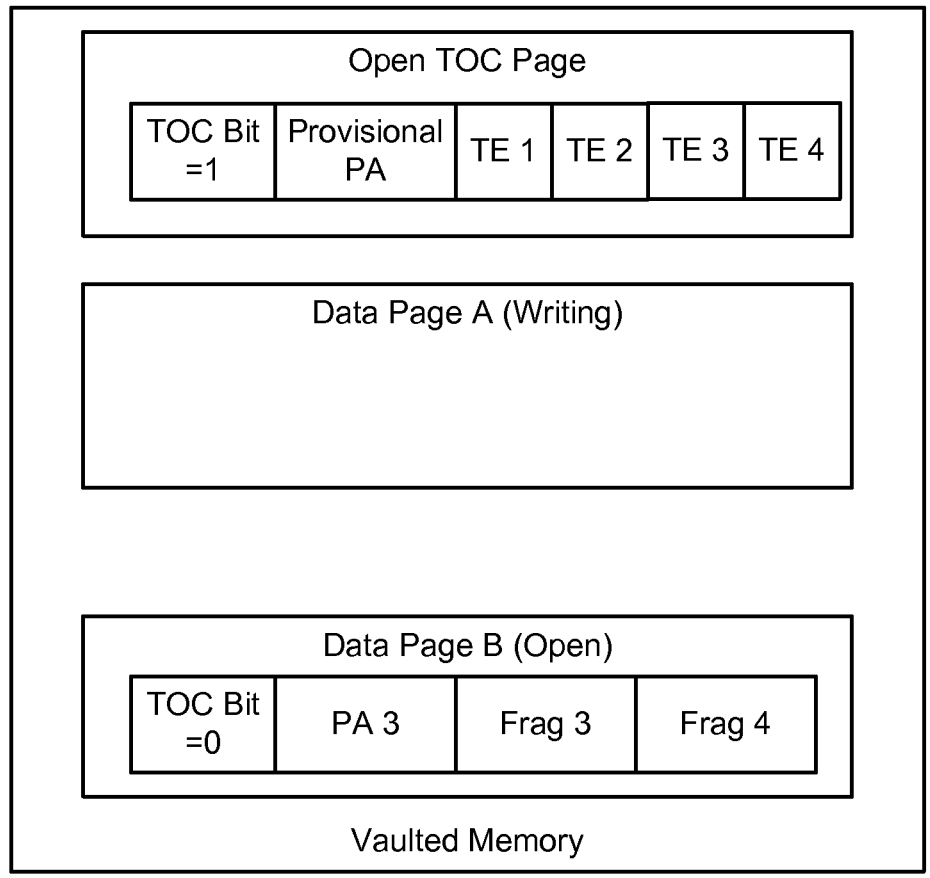

At some later point in time, the contents of Data Page A is written to PA 1 in the solid state memory module after which the contents of Data Page A are erased from Data Page A in vaulted memory. Further, frag 3 and frag 4 are written to Data Page B and the corresponding TOC entries (TE 3 and TE 4) are written to the open TOC page. FIG. 7D shows the state of the vaulted memory after the aforementioned events have occurred.

Figure 7E:
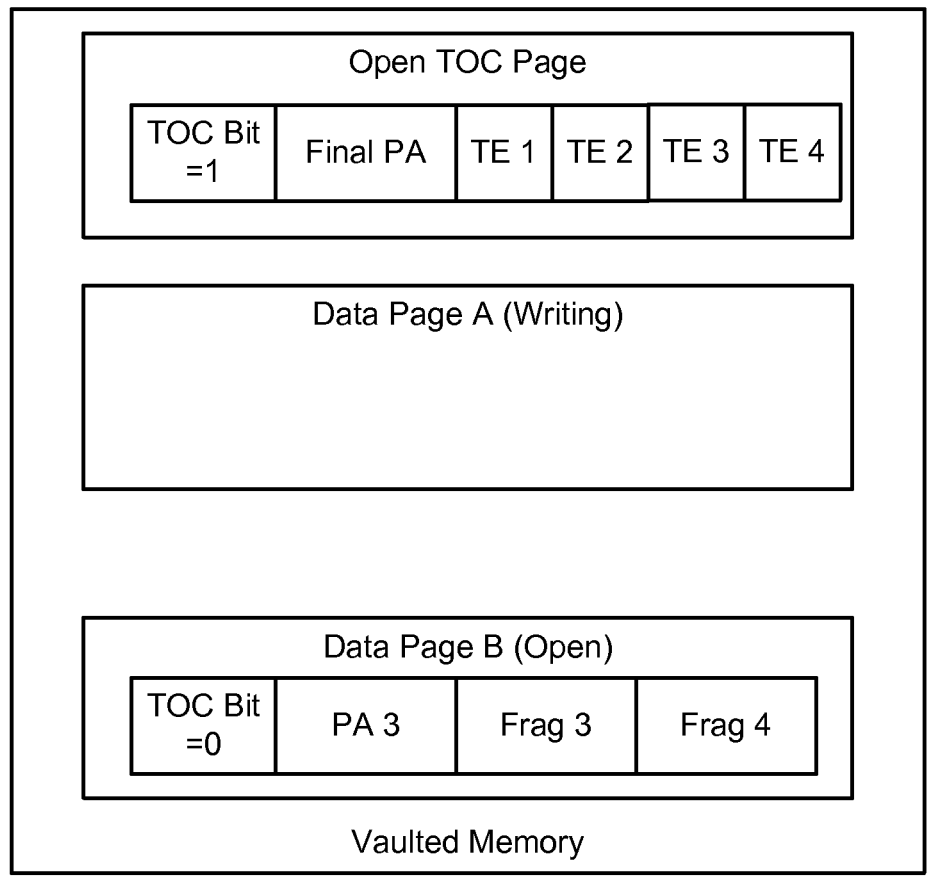

At this stage, the open TOC page is full (i.e., no more TOC entries may be stored in the open TOC page. Accordingly, a final physical address for the open TOC page (or the contents of the open TOC page) is determined. The tag in the open TOC page may be updated to include the final physical address. FIG. 7E shows the state of the vaulted memory after the aforementioned events have occurred.

As shown in FIG. 7E, both the open TOC page and Data Page B are full. Accordingly, the control module or the storage module controller may initiate the writing of the contents of the open TOC page and the contents of Data Page B to appropriate locations in the solid state memory module.

Figure 7F:
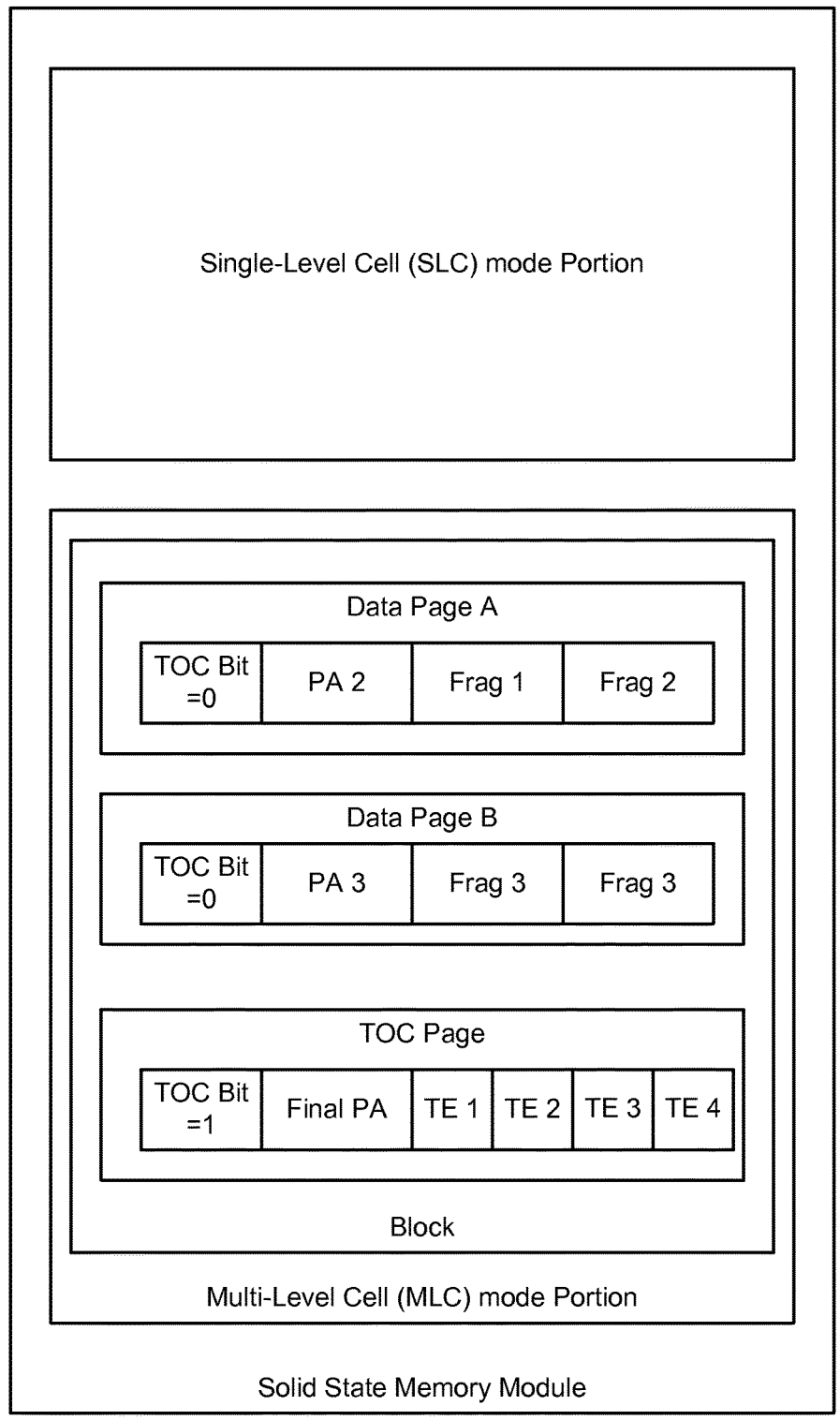

If the writing of the contents of the open TOC page to the solid state memory module is successful, then the solid state memory module will include a TOC page in a location corresponding to final physical address. Further, if the writing of the contents of the Data Page B to the solid state memory module is successful, then the solid state memory module will include a data page in a location corresponding to PA 2. Further, the aforementioned content may be written to the MLC mode portion of the solid state memory module using the appropriate MLC commands. FIG. 7F shows the state of the solid state memory module after the aforementioned events have occurred.

Figure 7G:
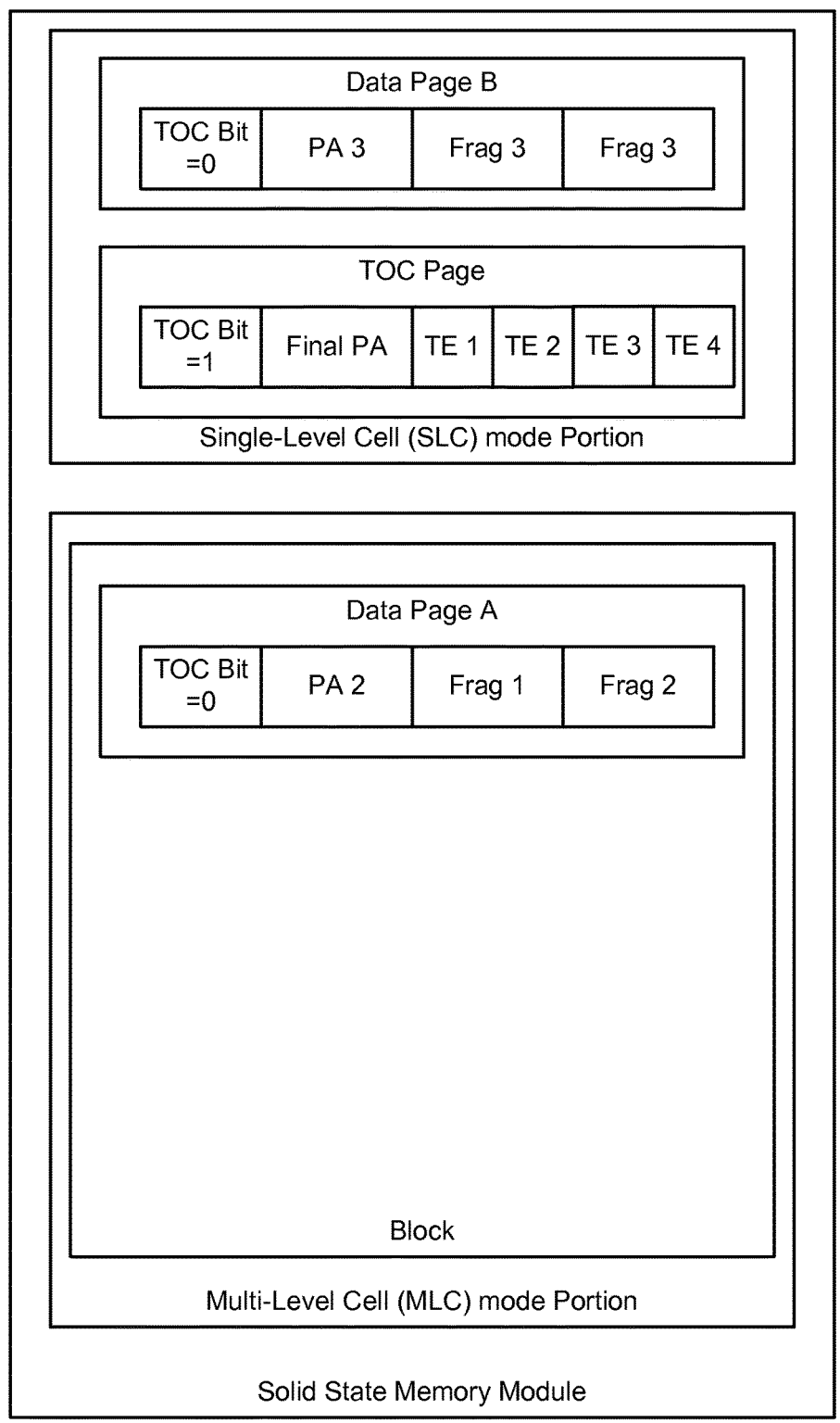

However, if a notification of a power failure is received prior to the contents of the TOC page (see FIG. 7E) and the contents of Data Page B (see FIG. 7E) being written to the solid state memory module, then the contents of the TOC page (see FIG. 7E) and the contents of Data Page B (see FIG. 7E) are written to the SLC mode portion of the solid state memory module using the appropriate SLC commands. The locations in which the aforementioned pages (e.g., the data page and the TOC page) are stored does not correspond to the physical address in that are present in the tags that are stored in the aforementioned pages. The aforementioned content may be stored only in the Least Significant Bit (LSB) pages within the SLC mode portion of the solid state memory module. In such cases, the size of the SLC mode portion may be larger (e.g., twice as large) as the size of the vaulted memory. FIG. 7G shows the state of the vaulted memory after the aforementioned events have occurred.

Figure 8A:
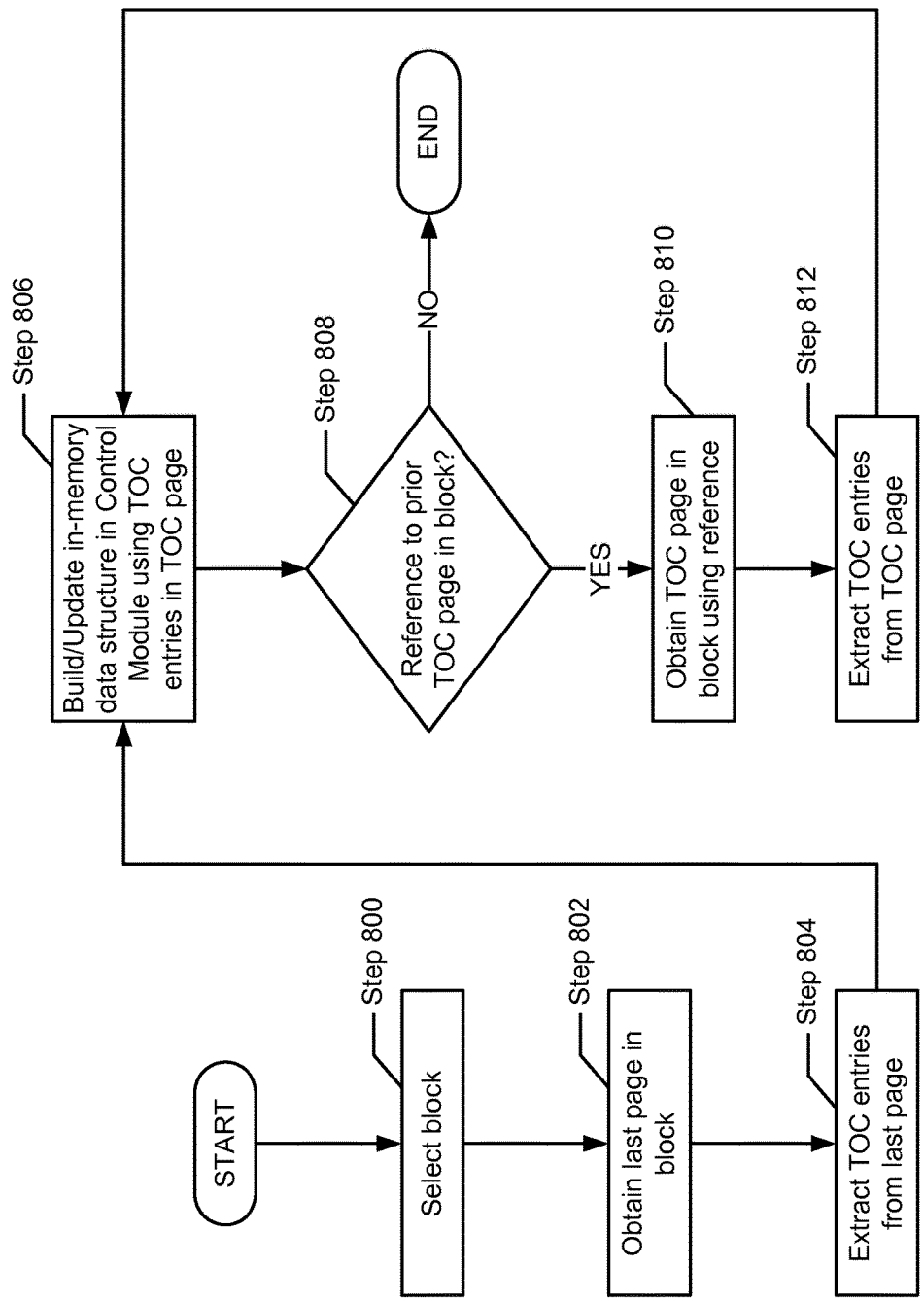
FIGS. 8A-8B show flowcharts in accordance with one or more embodiments of the technology.
Figure 8B:
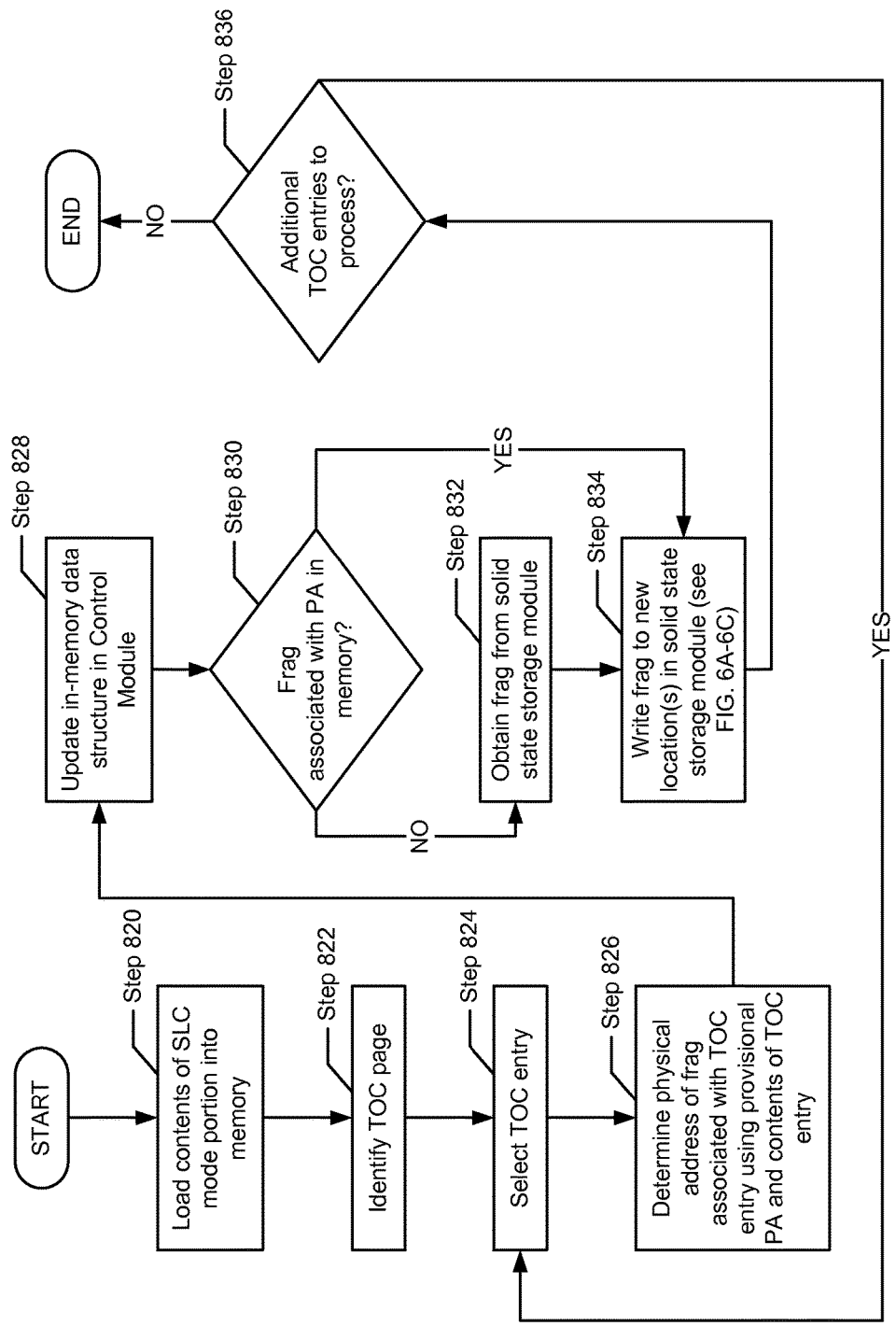

In one embodiment of the technology, when the control module is restarted, the TOC entries in the solid state memory modules may be used to generate the appropriate in-memory data structures (see e.g., FIG. 5) in order to permit the clients to access user data stored in the storage appliance. FIG. 8A shows a method for generating an in-memory data structure using the TOC entries stored in the MLC mode portion of the solid state memory module in accordance with one or more embodiments of the technology. FIG. 8B shows a method for generating an in-memory data structure using the TOC entries stored in the SLC mode portion of the solid state memory module in accordance with one or more embodiments of the technology. While the various steps in the aforementioned flowchart are presented and described sequentially, one of ordinary skill will appreciate that some or all of the steps may be executed in different orders, may be combined or omitted, and some or all of the steps may be executed in parallel.

Turning to FIG. 8A, in step 800, a block is selected. In step 802, the last page in the block is obtained. For example, the processor reads the contents of the last page. As discussed above, the last page of every block in the solid state memory modules within the storage appliance is a TOC page. In step 804, the TOC entries are extracted from the TOC page.

In step 806, each of the TOC entries obtained in Step 804 are processed to populate the in-memory data structure. More specifically, processing each TOC entry may include one or more following: (i) extracting the page ID and byte information from the TOC entry; (ii) combining the information in (i) with <storage module, channel, chip enable, LUN, plane, block> to obtain a physical address; (iii) extracting the object ID and offset ID (and optionally the birth time) from the TOC entry; (iv) applying a hash function to <object ID, offset ID> (or, optionally, <object ID, offset ID, birthtime>) to generate a hash value; and (v) populating the in-memory data structure with a mapping of the hash value and the physical address.

In one embodiment of the technology, the processor already includes information about the <storage module, channel, chip enable, LUN, plane, block> because the processor needed this information to obtain the last page of the block. In one embodiment of the technology, the processor may use the Type field in the TOC entry to determine whether the frag is in a bad page. If the frag is stored in a bad page, the processor may not generate a mapping in the in-memory data structure for the TOC entry.

In step 808, once all TOC entries in the TOC page have been processed, a determination is made about whether the TOC page includes a reference to another TOC page in the block (i.e., the block selected in Step 800). If the TOC page includes a reference to another TOC page in the block, the process proceeds to Step 810; otherwise the process ends. In step 810, the referenced TOC page is obtained. In step 812, the TOC entries are extracted from the TOC page. The process then proceeds to Step 806.

Turning to FIG. 8B, in step 820, the contents from the SLC mode portion of the solid state memory module is loaded into the memory in the control module. The contents may include one or more open TOC pages, one or more open data pages, and one or more writing data pages. In one embodiment of the technology, all data that was resident in vaulted memory when the system lost power has now been copied into the control module's memory. Because the storage appliance implements a multicast write mechanism (see e.g., FIG. 6A-6C), there may be multiple copies of the data in the vaulted memory. Regardless of the specific content in any given SLC mode portion of the solid state memory module, each page that is stored in the SLC mode portion includes a tag (see e.g., FIG. 7G).

In step 822, a TOC page is identified from content obtained in step 820. Identifying a TOC page may include searching for a page in the aforementioned obtained content that includes a TOC bit that is set with a status to indicate that the page is a TOC page. For example, a page that includes a TOC bit=1 may be identified as a TOC page.

In step 824, a TOC entry from the TOC page identified in step 822 is obtained. In one embodiment of the technology, if multiple copies of the TOC page are present in the control module memory, then each copy of the TOC page is verified to determine that the specific TOC entry (i.e., the TOC entry that is obtained in step 824) is identical in each copy of the TOC page.

In step 826, the physical address of the frag that corresponds to the TOC entry obtained in step 824 is determined using the physical address in the tag in the TOC page and the content of the TOC entry. For example, the provisional physical address of the TOC page may be <storage module 1, channel 1, chip enable 1, LUN 1, plane 1, block 2, page 2, byte 0> and the  information from selected TOC entry may be  (see e.g., FIG. 4F, 440, 442). Accordingly, the physical address of the frag corresponding to the TOC entry may be <storage module 1, channel 1, chip enable 1, LUN 1, plane 1, block 2, page 2, byte 5>. Those skilled in the art will appreciate that while the aforementioned physical address is represented as an n-tuple, the aforementioned physical address may be, for example, a 48-bit physical address.

In step 828, the in-memory data structure in the control module is updated to include a mapping of the <object ID, offset ID> (which are obtained from the TOC entry) and the physical address determined in step 826. Other mappings based on the aforementioned information may be stored in the in-memory data structure without departing from the technology (see FIG. 5).

In step 830, the memory in the control module is then searched in order to locate the frag corresponding to the physical address determined in step 826. If the frag is present in the memory, then the process proceeds to step 834; otherwise the process proceeds to step 832.

The following is a non-limiting example for locating a corresponding frag in the memory of the control module. Consider a scenario in which the physical address for the frag determined in step 826 is <storage module 1, channel 1, chip enable 1, LUN 1, plane 1, block 2, page 2, byte 5>, then the control module may search its memory to locate a page that includes a tag that includes a TOC bit=0 and a physical address that includes <storage module 1, channel 1, chip enable 1, LUN 1, plane 1, block 2, page 2>. If such a page is located, then the frag is determined to be in the memory; otherwise, the frag is determined to be in the solid state memory module.

In step 832, the frag is obtained from the solid state memory module using the physical address obtaining in step 826.

In step 834, the frag (either obtained in step 832 or identified as being present in step 830) is written to a new location is the storage module in accordance with FIGS. 6A-6C.

In one embodiment of the technology, if the frag is not present in the memory (i.e., the frag is present in the solid state memory module), then instead of copying the corresponding frags into the memory when processing the TOC entries in accordance with FIG. 8B, the frags may be marked for garbage collection. More specifically, the frags may be marked such that they will be relocated to other locations in the solid state memory module as part of a garbage collection operation.

Continuing with the discussion of FIG. 8B, in step 836, a determination is made about whether there are additional TOC entries to process. If there are additional TOC entries to process, then the method proceeds to step 824; otherwise the process ends.

In one embodiment of the technology, the method shown in FIG. 8B may be performed on every open TOC page stored in the memory. Further, method in FIG. 8B may be performed in parallel for all TOC pages in the memory when the system is powered on.

In one embodiment of the technology, the method in FIG. 8A may be performed in parallel for all blocks (or a subset of blocks) within the storage appliance when the system is powered on. Further, the method in FIG. 8A may be performed in parallel with the method shown in FIG. 8B. Following this process, the resulting in-memory data structure may be updated by the processor as new user data is written to the storage appliance.

While the aforementioned discussion indicates that TOC pages, open data pages, and writing data pages may be written to the SLC mode portion of the solid state memory, the technology may be implemented without the solid state memory module having an SLC mode portion and an MLC mode portion.

For example, the technology may be implemented using solid state memory modules operating using, e.g., MLC mode, and that include a reserved portion and a non-reserved portion, where the reserved portion corresponds to a portion of the solid state memory module that is used to store content from open TOC pages, open data pages, and writing data pages in the event of a power failure (or notification of a power failure) and the non-reserved portion of the solid state memory module that is used to store content from TOC pages and the writing data pages in accordance with FIG. 6B and FIG. 6C.

In another example, the technology may be implemented using solid state memory modules operating using, e.g., SLC mode, and that include a reserved portion and a non-reserved portion, where the reserved portion corresponds to a portion of the solid state memory module that is used to store content from TOC pages, open data pages, and writing data pages in the event of a power failure (or notification of a power failure) and the non-reserved portion of the solid state memory module that is used to store content from TOC pages and the writing data pages in accordance with FIG. 6B and FIG. 6C.

Those skilled in the art will appreciate that while the technology has been described with respect to implementing the technology in solid state memory modules, embodiments of the technology may be implemented using other types of non-volatile storage mediums.

Those skilled in the art will appreciate that while the technology has been described with respect to co-locating the vaulted memory in the same location as the persistent storage (e.g., the solid state memory modules), embodiments of the technology may be implemented in which the vaulted memory is not co-located with the persistent storage.

Those skilled in the art will appreciate that while the technology has been described with respect to the last page in each block being reserved as a TOC page, embodiments of the technology may be implemented by setting another page in the block as a reserved TOC page without departing from the technology.

In one embodiment of the technology, the in-memory data structure is generated prior to any operations (e.g., read operation, a write operation, and/or an erase operation) being performed on any datum stored in the solid state memory modules.

One or more embodiments of the technology provide a system and method in which all user data stored in the storage appliance is co-located with its metadata. In this manner, all user data stored in the storage appliance is self-describing. By arranging the user data and corresponding metadata according to the various embodiments of the technology, the storage appliance is better protected against failure of a given solid state memory module (or a subset thereof). Said another way, if a given solid state memory module (or subset thereof) fails, the user data in other solid state memory modules in the system is still accessible because the metadata required to access the user data in the other solid state memory module is itself located in the other solid state memory modules.

Further, embodiments of the technology enable the creation of an in-memory data structure, which allows the control module to access user data in a single look-up step. Said another way, the control module may use the in-memory data structure to directly ascertain the physical address(es) of the user data in the storage appliance. Using this information, the control module is able to directly access the user data and does not need to traverse any intermediate metadata hierarchy in order to obtain the user data.

One or more embodiments of the technology may be implemented using instructions executed by one or more processors in the system. Further, such instructions may correspond to computer readable instructions that are stored on one or more non-transitory computer readable mediums.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A method for storing data, comprising:
   writing a frag to an open data page in vaulted memory, wherein the open data page comprises a first table of contents (TOC) bit and a first physical address;
   writing a first table of contents entry (TE) for the frag to an open TOC page in the vaulted memory, wherein the open TOC page comprises a second TOC bit, a second physical address, and a second TE;
   receiving an event notification of a power failure for a storage module in which the vaulted memory is located;
   in response to the event notification:
      writing the frag to a page in a solid state memory module in the storage module, wherein the page is not associated with the first physical address; and
      writing the first TE and the second TE to a second page in the solid state memory module, wherein the second page is not associated with the second physical address;
   after powering on the storage module:
      loading contents of the page and the second page from the solid state memory module into a memory of a control module;
      identifying the first TE in the memory;
      determining a third physical address based on the second physical address and at least a portion of the first TE;
      determining, using the third physical address, that the frag is located in the memory;
      initiating the writing of the frag to a fourth physical address in one selected from a group consisting of the solid state memory module and another solid state memory module.

2. The method of claim 1, further comprising:
   after powering on the storage module:
      identifying the second TE in the memory;
      determining a fourth physical address based the second physical address and at least a portion of the second TE;
      determining, using the fourth physical address, that a second frag associated with the fourth physical address is not located in the memory;
      initiating a garbage collection operation to relocate the second frag to another location in one selected from a group consisting of the solid state memory module and another solid state memory module.

3. The method of claim 2, wherein the page and the second page are associated with a reserved portion of the solid state memory module and wherein the second frag is stored in a third page in the solid state memory module, wherein the third page is associated with a non-reserved portion of the solid state memory module.

4. The method of claim 3, wherein the solid state memory module is flash memory, wherein the reserved portion is operating in single-level cell (SLC) mode, and wherein the non-reserved portion is operating in multi-level cell (MLC) mode.

5. The method of claim 1, wherein the page and the second page are associated with a reserved portion of the solid state memory module.

6. The method of claim 1, wherein the solid state memory module is flash memory and wherein the reserved portion is operating in single-level cell (SLC) mode.

7. The method of claim 1, wherein the page and the second page are least significant bit (LSB) pages the solid state memory module.

8. A non-transitory computer readable medium for storing data comprising computer readable program code for:
   writing a frag to an open data page in vaulted memory, wherein the open data page comprises a first table of contents (TOC) bit and a first physical address;
   writing a first table of contents entry (TE) for the frag to an open TOC page in the vaulted memory, wherein the open TOC page comprises a second TOC bit, a second physical address, and a second TE;
   receiving an event notification of a power failure for a storage module in which the vaulted memory is located;
   in response to the event notification:
      writing the frag to a page in a solid state memory module in the storage module, wherein the page is not associated with the first physical address; and
      writing the first TE and the second TE to a second page in the solid state memory module, wherein the second page is not associated with the second physical address;
   after powering on the storage module:
      loading contents of the page and the second page from the solid state memory module into a memory of a control module;
      identifying the first TE in the memory;
      determining a third physical address based on the second physical address and at least a portion of the first TE;
      determining, using the third physical address, that the frag is located in the memory;
      initiating the writing of the frag to a fourth physical address in one selected from a group consisting of the solid state memory module and another solid state memory module.

9. The non-transitory computer readable medium of claim 8, further comprising computer readable program code for:
   after powering on the storage module:
      identifying the second TE in the memory;
      determining a fourth physical address based the second physical address and at least a portion of the second TE;
      determining, using the fourth physical address, that a second frag associated with the fourth physical address is not located in the memory;
      initiating a garbage collection operation to relocate the second frag to another location in one selected from a group consisting of the solid state memory module and another solid state memory module.

10. The non-transitory computer readable medium of claim 9, wherein the page and the second page are associated with a reserved portion of the solid state memory module and wherein the second frag is stored in a third page in the solid state memory module, wherein the third page is associated with a non-reserved portion of the solid state memory module.

11. The non-transitory computer readable medium of claim 10, wherein the solid state memory module is flash memory, wherein the reserved portion is operating in single-level cell (SLC) mode, and wherein the non-reserved portion is operating in multi-level cell (MLC) mode.

12. The non-transitory computer readable medium of claim 8, wherein the page and the second page are least significant bit (LSB) pages the solid state memory module.

13. A method for storing data, comprising:
   writing a frag to an open data page in vaulted memory, wherein the open data page comprises a first table of contents (TOC) bit and a first physical address;
   writing a first table of contents entry (TE) for the frag to an open TOC page in the vaulted memory, wherein the open TOC page comprises a second TOC bit, a second physical address, and a second TE;
   receiving an event notification of a power failure for a storage module in which the vaulted memory is located;
   in response to the event notification:
      writing the frag to a page in a solid state memory module in the storage module, wherein the page is not associated with the first physical address; and
      writing the first TE and the second TE to a second page in the solid state memory module, wherein the second page is not associated with the second physical address;
   after powering on the storage module:
      loading contents of the page and the second page from the solid state memory module into a memory of a control module;
      identifying the second TE in the memory;
      determining a third physical address based on the second physical address and at least a portion of the second TE;
      determining, using the third physical address, that a second frag associated with the third physical address is not located in the memory;
      initiating a garbage collection operation to relocate the second frag to another location in one selected from a group consisting of the solid state memory module and another solid state memory module.

14. The method of claim 13, wherein the page and the second page are associated with a reserved portion of the solid state memory module and wherein the second frag is stored in a third page in the solid state memory module, wherein the third page is associated with a non-reserved portion of the solid state memory module.

15. The method of claim 14, wherein the solid state memory module is flash memory, wherein the reserved portion is operating in single-level cell (SLC) mode, and wherein the non-reserved portion is operating in multi-level cell (MLC) mode.

16. The method of claim 13, wherein the page and the second page are associated with a reserved portion of the solid state memory module.

17. The method of claim 13, wherein the solid state memory module is flash memory and wherein the reserved portion is operating in single-level cell (SLC) mode.

18. The method of claim 13, wherein the page and the second page are least significant bit (LSB) pages the solid state memory module.

* * * * *